(12) United States Patent
Nakano et al.

(10) Patent No.: US 7,015,556 B2
(45) Date of Patent: Mar. 21, 2006

(54) PACKAGING SUBSTRATE AND MANUFACTURING METHOD THEREOF, INTEGRATED CIRCUIT DEVICE AND MANUFACTURING METHOD THEREOF, AND SAW DEVICE

(75) Inventors: Masahiro Nakano, Tokyo (JP); Katsuhiko Gunji, Tokyo (JP); Yasunobu Oikawa, Tokyo (JP); Katsuo Sato, Tokyo (JP)

(73) Assignee: TDK Corporation, Tokyo (JP)

( * ) Notice: Subject to any disclaimer, the term of this patent is extended or adjusted under 35 U.S.C. 154(b) by 14 days.

(21) Appl. No.: 10/813,393

(22) Filed: Mar. 31, 2004

(65) Prior Publication Data

US 2004/0251560 A1   Dec. 16, 2004

Related U.S. Application Data

(62) Division of application No. 10/298,228, filed on Nov. 18, 2002.

(30) Foreign Application Priority Data

| Nov. 16, 2001 | (JP) | ............................. 2001-352449 |
| Nov. 16, 2001 | (JP) | ............................. 2001-352451 |
| Nov. 16, 2001 | (JP) | ............................. 2001-352452 |
| Nov. 19, 2001 | (JP) | ............................. 2001-353195 |

(51) Int. Cl.
  *H01L 29/84*   (2006.01)
  *H01L 22/48*   (2006.01)
(52) U.S. Cl. ...................... 257/416; 257/254; 257/482; 257/777; 257/778
(58) Field of Classification Search .................... None
  See application file for complete search history.

(56) References Cited

U.S. PATENT DOCUMENTS

| 5,901,041 | A   | 5/1999 | Davies et al. |
| 6,392,294 | B1  | 5/2002 | Yamaguchi |
| 6,437,439 | B1  | 8/2002 | Shimoe |
| 2004/0108560 | A1 * | 6/2004 | Taga .......................... 257/416 |

* cited by examiner

*Primary Examiner*—David Nelms
*Assistant Examiner*—Long Tran
(74) *Attorney, Agent, or Firm*—McGinn IP Law Group, PLLC

(57) ABSTRACT

A basic portion layer 21 of a substrate electrode 12a connected to a projecting electrode 13 electrically and mechanically on a substrate member of ceramics. The substrate member on which the basic portion layer 21 is formed is subjected to sintering. A surface of the basic portion layer 21 in the sintered substrate member is polished. On the polished basic portion layer 21, the plating layers 22, 23 are formed, so that surface roughness of the substrate electrode 12a may be, for example, not larger than 0.1 μmRMS. Accordingly, junction strength of an integrated circuit element mounted on a packaging substrate by a flip-chip method can be improved.

4 Claims, 14 Drawing Sheets

PACKAGING SUBSTRATE AND MANUFACTURING METHOD THEREOF, INTEGRATED CIRCUIT DEVICE AND MANUFACTURING METHOD THEREOF, AND SAW DEVICE

This is a division of application Ser. No. 10/298,228 filed on Nov. 18, 2002.

BACKGROUND OF THE INVENTION

The present invention relates to a packaging substrate and a manufacturing method thereof, an integrated circuit device and a manufacturing method thereof, and an SAW device, in particular to a technique effectively applicable to the packaging substrate on which an integrated circuit element is mounted by flip-chip bonding, a technique effectively applicable to the integrated circuit device that an integrated circuit element is hermetically sealed on the packaging substrate, a technique effectively applicable to the integrated circuit device that an integrated circuit element and the packaging substrate are coupled with each other by ultrasonic sound, and a technique effectively applicable to the SAW device which has a pair of resonators each having a shape of the teeth of a comb.

In the integrated circuit device that an integrated circuit element is mounted on the packaging substrate, a flip-chip method is considered as one of mounting methods thereof. In the flip-chip method, projecting electrodes are formed on element electrodes of the integrated circuit element, and then the projecting electrodes are directly coupled to substrate electrodes formed on a packaging substrate. Further, a wire-bonding method is also considered as another one of the mounting methods thereof. In the wire-bonding method, the integrated circuit element is coupled to the packaging substrate, and then the element electrodes of the integrated circuit element and the substrate electrodes of the packaging substrate are coupled to each other through wires.

Herein, in the wire-bonding method that a wire-bonding is carried out by the use of gold (Au) wiring, aluminum (Al) wiring, or the like, the substrate electrodes formed on the packaging substrate, in particular on the packaging substrate of ceramics, are formed by printing a conductive material on a surface of the packaging substrate. Subsequently, roughness of the surfaces of the substrate electrodes reflects diameters of particles of the conductive material constituting the substrate electrodes or materials of the packaging substrate, namely, roughness of substrate members, as it stands.

In the wire-bonding method, since the integrated circuit element is coupled to the packaging substrate, as mentioned above, junction portions in the substrate electrodes of the packaging substrate to be bonded to the wires are not such portions to which stress is structurally applied, when mechanical impact, vibrations, or thermal impact are applied to a whole of the device. Consequently, reliability of junction of the junction portions is generally estimated by a wire-pull test.

Generally, pull-strength in the wire-pull test is approximately between 5 g and 40 g. In addition, destroy is caused to occur not by a break in the junction portions between the wires and the substrate electrodes but by a break of the wires. In view of these, it is necessary that the junction portions have strength larger than breaking strength of the wires in the wire-bonding method. As a result, it becomes necessary that the junction of the substrate electrodes formed on the packaging substrate is not destroyed by a strength not larger than the breaking strength of the wires.

Besides, in the above-mentioned flip-chip method, roughness of the surfaces of the substrate electrodes of the packaging substrate is similar to that in the wire-bonding method. Accordingly, any attention has not been paid to decision of the roughness in the flip-chip method.

In a case that a color of the substrate members is white, like an LTCC (Low Temperature Cofired Ceramics) substrate, reproducibility cannot be obtained in the conductive patterns of the substrate electrode portions due to roughness of a surface of each substrate electrode. It is therefore difficult that a position of the substrate electrode with respect to the substrate members is optically recognized. On the other hand, in the flip-chip method that the integrated circuit element and the packaging substrate are coupled to each other by the projecting electrodes, requirements for junction strength are different from those of the wire-bonding method.

Namely, in the flip-chip method, since the integrated circuit element and the packaging substrate are coupled to each other by the projecting electrodes, stress caused by the mechanical impact or vibrations is concentrated on the projecting electrodes. As a result, reliability of junction depends on junction strength between the projecting electrodes and the substrate electrodes. Herein, reliability of junction portions between the projecting electrodes and the substrate electrodes can be estimated by a die-share test.

On the other hand, in recent years, a mobile communication terminal equipment, such as a portable telephone, and the like has been rapidly progressed. From the viewpoint of convenience of portability or handiness, it is strongly desired that the mobile communication terminal equipment is not only small in size but also light in weight. In order to fabricate such a small and a light terminal equipment, it is essentially required that an electronic part or device used therein is also small in size and light in weight. Under the circumstances, many SAW elements, each of which has advantage for being fabricated small and light and each of in which a plurality of SAW resonators are formed in a piezo-electric substrate, have been used in a high-frequency section and an intermediate-frequency section of the terminal equipment.

An insertion loss and attenuation outside the pass band can be pointed out as important characteristics required for the SAW element, when the SAW element is used as a filter. Herein, the insertion loss influences power consumption of the mobile communication terminal equipment including the SAW element. The insertion loss becomes lower, the life of a battery included in the mobile communication terminal equipment becomes longer. Therefore, a capacity of the battery can be reduced, dependent on the insertion loss. Accordingly, the mobile communication terminal equipment can be fabricated small in size and light in weight, when the insertion loss can be low. Further, when wide range attenuation outside the pass band can be obtained in a filter, the mobile communication terminal equipment can also be fabricated small in size and light in weight.

Herein, the SAW element used in the SAW device has a pair of exciting electrode portions each of which has a shape of the teeth of a comb and which are formed on a piezo-electric substrate with being involved in each other. With the structure, in the SAW element, an electric field generated by applying voltage between the exciting electrode portions produces a surface acoustic wave (SAW) on the piezo-electric substrate. On the other hand, a produced surface acoustic wave (SAW) is converted into an electric signal by the exciting electrode portions also in the SAW element. In the SAW device having such an SAW element, adhesive are painted circularly on an area to be adhered to a cap. As a result, the adhesive are also painted not only on the substrate electrodes but also on a surface of the packaging substrate in which the substrate electrodes are not formed.

Herein, although the adhesive of resin can be adhered to the packaging substrate of ceramics itself with a large adhering strength, the adhesive of resin cannot be adhered to a metal, such as a plating layer, a substrate electrode, or the like with such a large adhering strength. Therefore, the cap adhered to the packaging substrate by the adhesive can be adhered at a sufficiently large strength to a portion in which the substrate electrodes are not formed. However, the cap adhered to the packaging substrate by the adhesive cannot be adhered at a desirable strength to a portion in which the substrate electrodes are formed. As a result, water invades from a portion between the substrate electrodes and the adhesive into the SAW device. Accordingly, reliability as the SAW device is so damaged. This problem is caused to occur not only in the SAW device but also in every integrated circuit device that an integrated circuit element is mounted on a packaging substrate.

Further, in such an SAW device, a packaging substrate on which an SAW element is mounted by the flip-chip method is not made of resin but mainly made of ceramics, such as alumina, LTCC, or the like, that is harder than the resin. Under the circumstances, in order to achieve fabrication of the SAW device that is small in size, light in weight, and low in cost, it is desirable that the packaging substrate is made of resin. However, if the packaging substrate is made of resin softer than the ceramics, the packaging substrate is inevitably bended while ultrasonic wave vibration is applied thereon in the flip-chip mounting. As a result, the ultrasonic wave power is not applied sufficiently on a surface by which the projecting electrodes and the packaging substrate are kept in contact with each other. Consequently, it becomes difficult that a necessary share strength is achieved. This problem is also caused to occur not only in the SAW device but also in every integrated circuit device that an integrated circuit element is mounted on a packaging substrate by the flip-chip method.

On the other hand, assuming that the SAW device is used within a mobile communication terminal, the SAW device meets some requirements. It is required for the SAW device that contact of the SAW element with the packaging substrate is maintained, even if the SAW device has been dropped from a height of 2 m. Herein, the height of 2 m is decided by adding a predetermined margin to a height by which a general user uses the mobile communication terminal.

In the interim, it is enough to enlarge area of the bumps as large as possible in order to achieve the above-mentioned performance of junction, in a case that the SAW element is flip-chip mounted in the packaging substrate by bumps. Subsequently, in order to enlarge the area of the bumps, it becomes inevitably necessary to enlarge area of a piezo-electric substrate constituting the SAW element. However, it is difficult to enlarge the area of the piezo-electric substrate, from the view point of requirements for making the terminal equipment small in size and light in weight. As a result, it is not possible that only the area of the bumps is merely enlarged.

SUMMARY OF THE INVENTION

It is therefore an object of the present invention to provide a technique which is capable of improving junction strength of an integrated circuit element mounted on a packaging substrate by a flip-chip method.

It is another object of the present invention to provide a technique which is capable of improving adhering strength of a sealing member adhered to a packaging substrate for hermetically sealing an integrated circuit element mounted on the packaging substrate.

It is yet another object of the present invention to provide a technique which is capable of improving share-strength of an integrated circuit element mounted on a packaging substrate by a flip-chip method.

It is still another object of the present invention to provide a technique which is capable of maintaining junction strength of an SAW element mounted on a packaging substrate through a plurality of bumps and which is also capable of minimizing an area of the bumps.

According to an aspect of the present invention, there is provided a method of manufacturing a packaging substrate on which an integrated circuit element is mounted, said integrated circuit element having an element substrate, a predetermined conductive pattern and a projecting electrode formed on said element substrate, said method comprising the steps of:

forming a basic portion layer of a substrate electrode on a substrate member of ceramics, said substrate electrode being electrically and mechanically connected with said projecting electrode;

sintering said substrate member on which said basic portion layer has been formed;

polishing a surface of said basic portion layer on the sintered substrate member; and forming a plating layer on the polished basic portion layer.

A surface roughness of said substrate electrode may be not larger than 0.1 $\mu$mRMS after said plating layer has been formed.

According to another aspect of the present invention, there is provided a packaging substrate on which an integrated circuit element is mounted, said integrated circuit element having an element substrate, a predetermined conductive pattern and a projecting electrode formed on said element substrate, comprising:

a substrate electrode which is formed on said packaging substrate and which is composed of a basic portion layer and a plating layer formed on said basic portion layer, said substrate electrode being electrically and mechanically connected with said projecting electrode; and surface roughness of said substrate electrode is not larger than 0.1 $\mu$mRMS.

In the invention thus mentioned, the plating layer is formed after the surface of the basic portion layer of the substrate electrode is polished. As a result, the surface roughness of the substrate electrode is remarkably improved. It is therefore possible to largely improve share-strength of the integrated circuit element mounted on the packaging substrate by the flip-chip method.

According to yet another aspect of the present invention, there is provided an integrated circuit device comprising:

an integrated circuit element having an element substrate on which a predetermined conductive pattern and an element electrode are formed;

a packaging substrate on which a substrate electrode is formed, said substrate electrode being consisting of a conductive material with a glass material is mixed in the conductive material, a film-coated layer of a glass material being formed circularly in a sealing member adhering area including a portion on said substrate electrode, said integrated circuit element being mounted on said packaging substrate with said substrate electrode being electrically connected with said element electrode; and a sealing member for hermetically sealing said integrated circuit element, said sealing member being adhered on said packaging substrate through an adhesive positioned on said film-coated layer.

In the invention thus mentioned, the film-coated layer of a glass material is formed on the substrate electrode in which a glass material is mixed. Both the film-coated layer and the substrate electrode are thereby strongly adhered to each other. Further, the sealing member is adhered on said packaging substrate through an adhesive positioned on said film-coated layer. It is therefore possible to largely improve adhering strength of the sealing member to said packaging substrate.

According to still another aspect of the present invention, there is provided a packaging substrate having an element mounting surface on which an integrated circuit element is mounted, said integrated circuit element having an element substrate, a predetermined conductive pattern and a projecting electrode formed on said element substrate, said packaging substrate comprising:

an external connecting terminal which has a predetermined height and which is electrically connected with a mounting substrate; and a supporting layer which has a thickness not smaller than said predetermined height of said external connecting terminal;

said external connecting terminal and said supporting layer being formed on a terminal forming surface positioned at a side opposite to said element mounting surface;

said supporting layer being formed at least in an area corresponding to a position where said integrated circuit element is mounted.

According to still yet another aspect of the present invention, there is provided a method of manufacturing an integrated circuit device, said method comprising the steps of:

preparing an integrated circuit element which has an element substrate, a predetermined conductive pattern and a projecting electrode formed on said element substrate;

preparing a packaging substrate which has an external connecting terminal having a predetermined height and is electrically connected with a mounting substrate, and a supporting layer which has a thickness not smaller than said predetermined height of said external connecting terminal; said supporting layer being formed at least in an area corresponding to a position where said integrated circuit element is mounted;

bringing said supporting layer into contact with said stage upon setting said packaging substrate on said stage with said element mounting surface being directed to the outside; and joining said integrated circuit element to said element mounting surface of said packaging substrate by applying ultrasonic wave vibration while pushing said integrated circuit element towards said supporting layer.

According to further another aspect of the present invention, there is provided a method of manufacturing an integrated circuit device, said method comprising the steps of:

preparing an integrated circuit element which has an element substrate, a predetermined conductive pattern and a projecting electrode formed on said element substrate;

preparing a packaging substrate which has an external connecting terminal electrically connected with a mounting substrate and formed on a terminal forming surface positioned at a side opposite to said element mounting surface;

preparing a stage having a supporting projection capable of being contact with at least an area corresponding to a position where said integrated circuit element is mounted except said external connecting terminal forming area on said terminal forming area;

setting said packaging substrate on said supporting projection of said stage with said element mounting surface being directed to the outside; and joining said integrated circuit element to said element mounting surface of said packaging substrate by applying ultrasonic wave vibration while pushing said integrated circuit element towards said supporting projection.

In the invention thus mentioned, the packaging substrate is never bended during the ultrasonic wave junction. It is therefore possible to largely improve share-strength of the integrated circuit element mounted on the packaging substrate by the flip-chip method.

According to still further another aspect of the present invention, there is provided an SAW device comprising:

an SAW element which has a piezo-electric substrate and at least one pair of resonators each of which has a shape of the teeth of a comb with being involved in each other;

a packaging substrate on which said SAW element is mounted through a plurality of bumps; and a ratio between a total area of said a plurality of bumps formed on said SAW element and a mass of the SAW element being not smaller than 0.0085 mm2/mg.

In the invention thus mentioned, it becomes possible that an area of the bumps is minimized while junction strength of the SAW element mounted on a packaging substrate through a plurality of bumps is maintained.

DETAILED DESCRIPTION OF THE
PREFERRED EMBODIMENTS

Hereinafter, embodiments according to the present invention will be described in further detail with reference to the drawings. Here, in the accompanying drawings, like numerals are denoted to like parts, and repeated explanation is omitted. Additionally, the embodiments according to the invention are embodiments particularly useful for carrying out the present invention, and the present invention is not limited to the embodiments.

Figure 1:
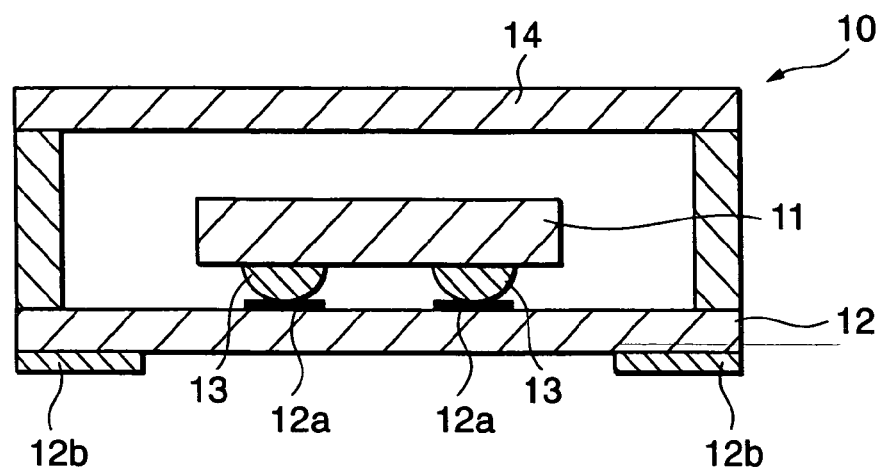
FIG. 1 is a sectional view for schematically showing an SAW device according to a first embodiment of the present invention, in which an SAW element is contained in a package.
Figure 2:
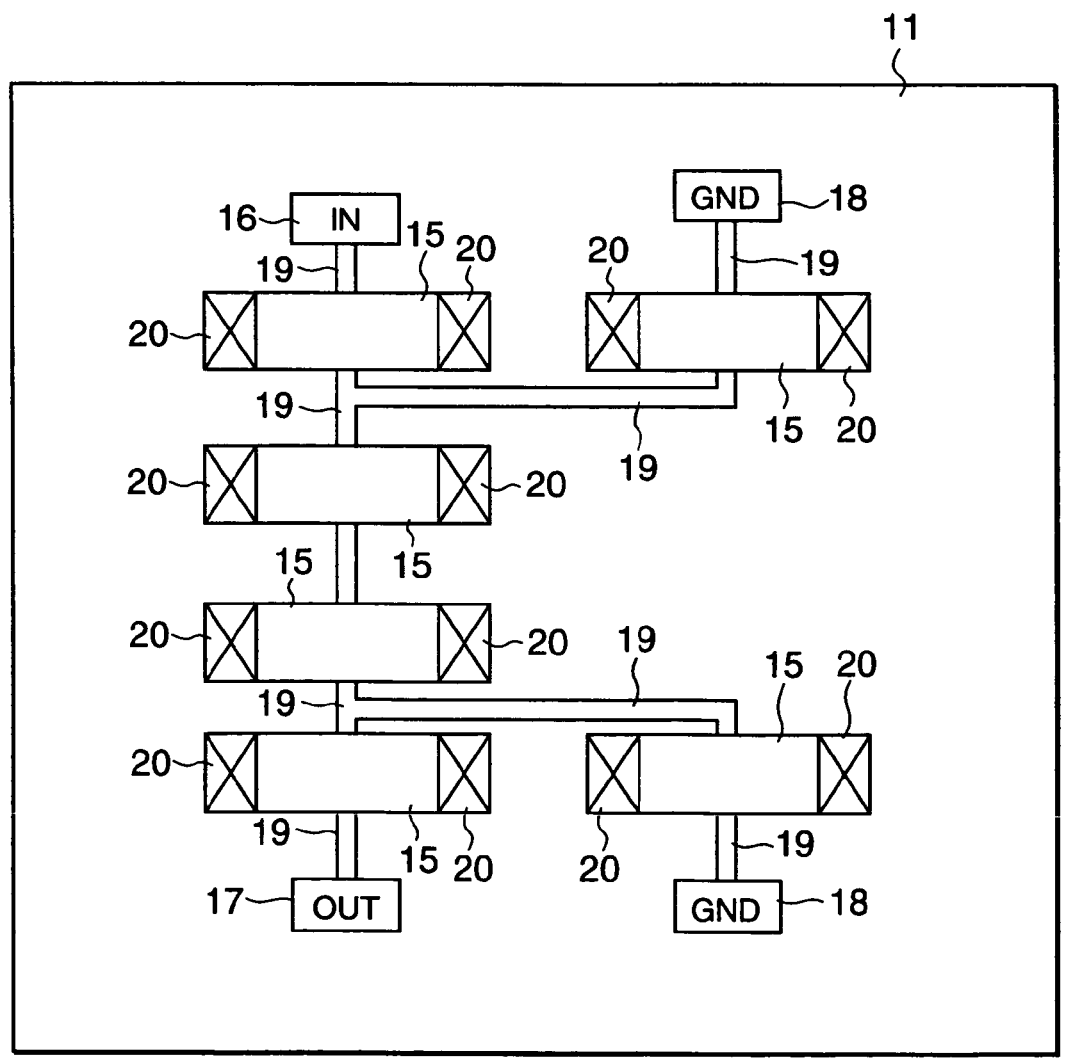
FIG. 2 is a schematic view for showing a circuit of the SAW element illustrated in FIG. 1.
Figure 3:
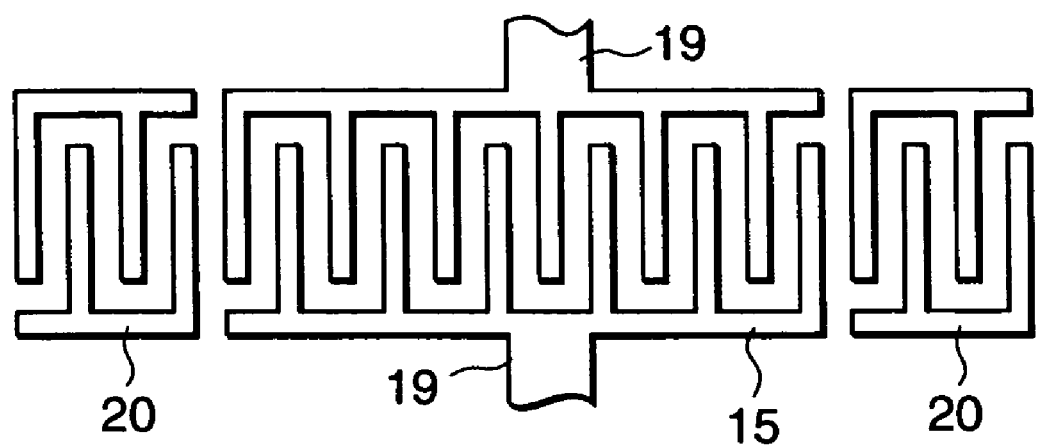
FIG. 3 is a plan view for showing a part of the SAW element illustrated in FIG. 2.
Figure 4:
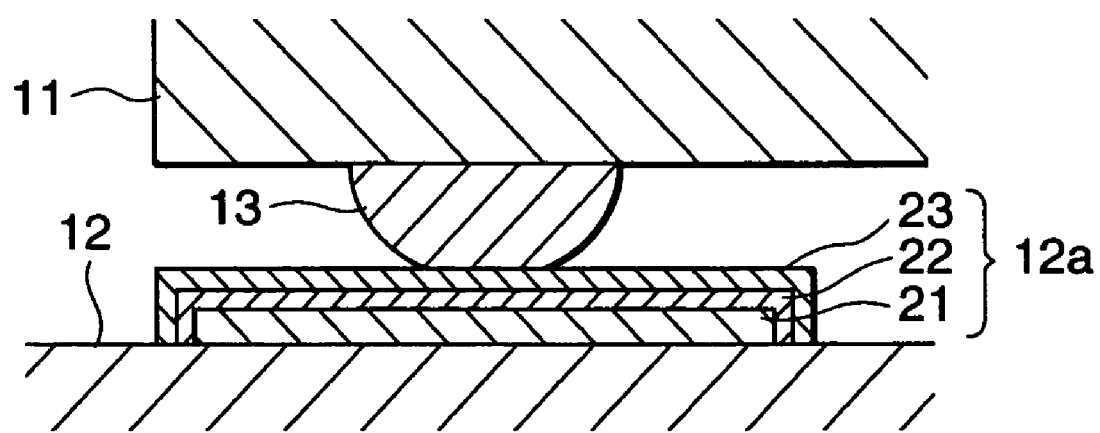
FIG. 4 is a sectional view for schematically showing a junction portion between a projection electrode and a substrate electrode in the SAW device illustrated in FIG. 1.
Figure 5:
FIG. 5 is a photograph of a surface of the substrate electrode on which a plating layer is formed by polishing a basic portion layer.
Figure 6:
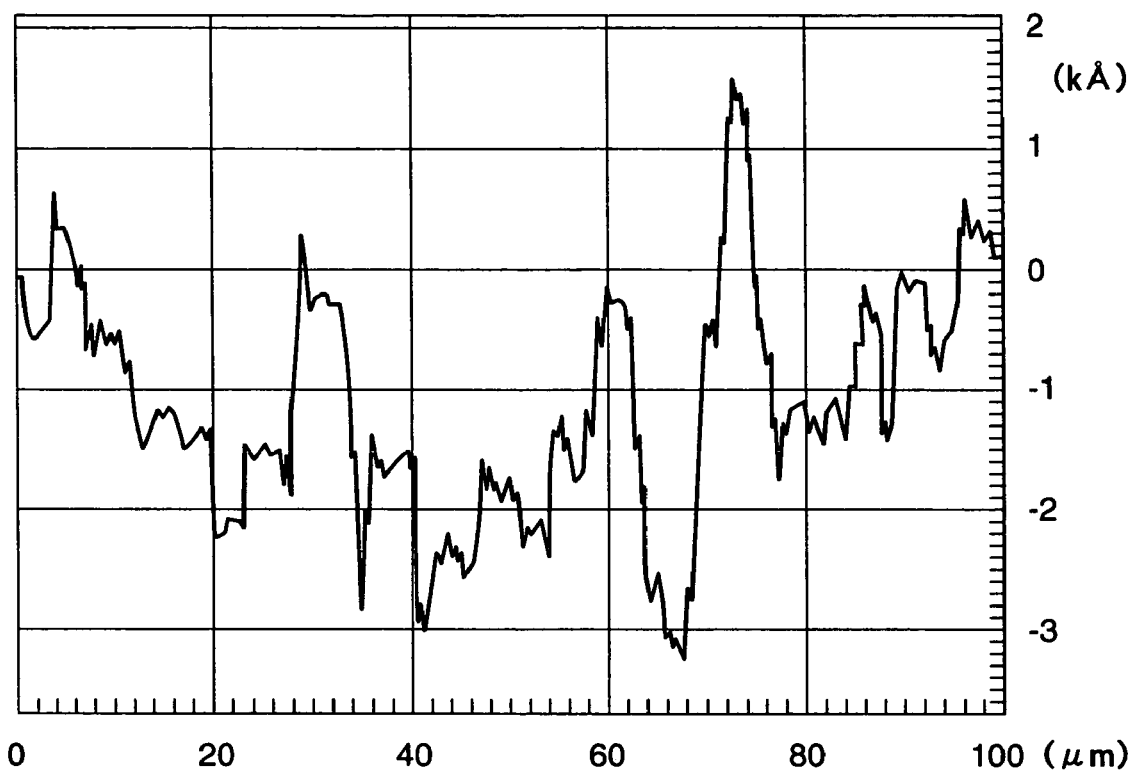
FIG. 6 is a graph for showing a surface roughness of the substrate electrode on which a plating layer is formed by polishing a basic portion layer.
Figure 7:
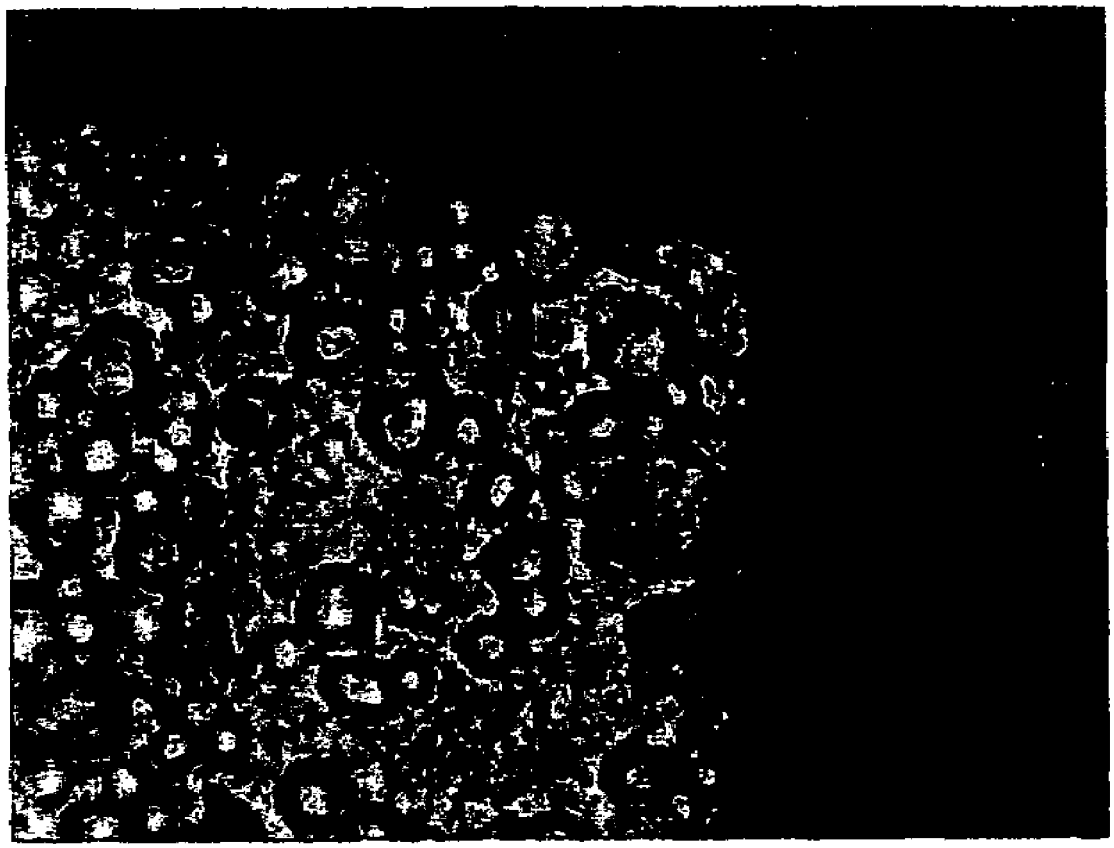
FIG. 7 is a photograph of a surface of the substrate electrode on which a plating layer is formed without polishing a basic portion layer.
Figure 8:
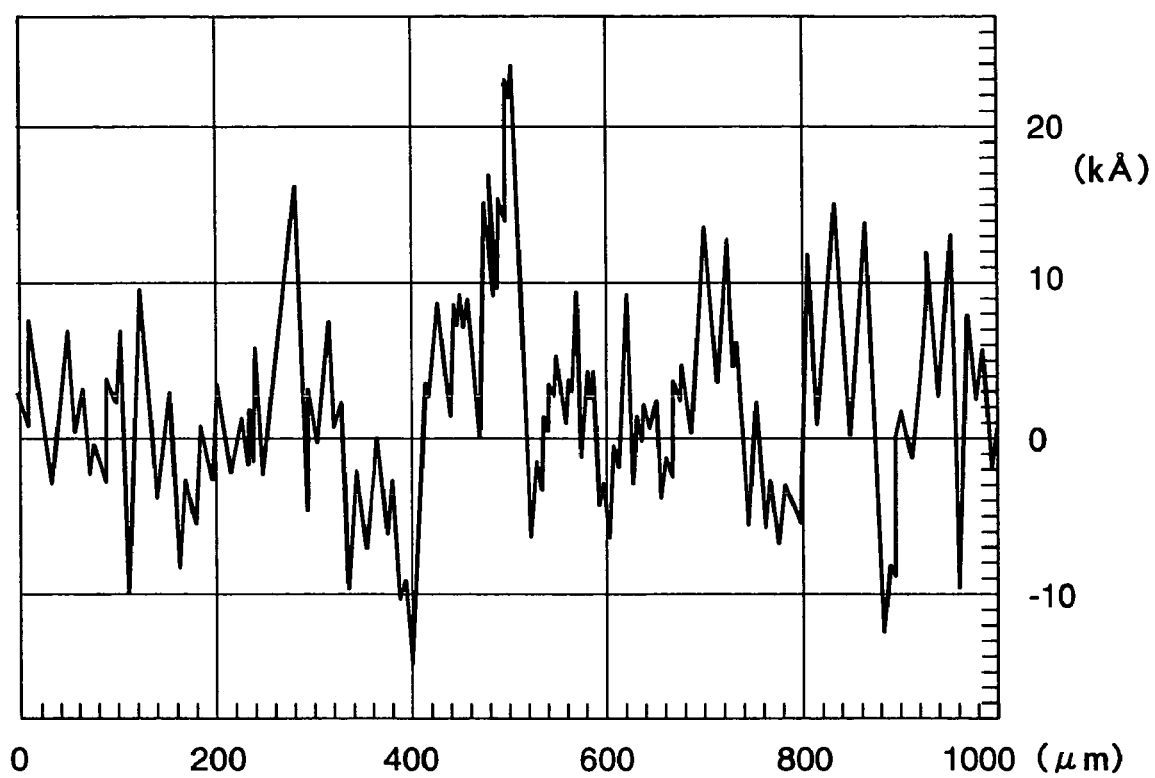
FIG. 8 is a graph for showing a surface roughness of the substrate electrode on which a plating layer is formed without polishing a basic portion layer.
Figure 9:
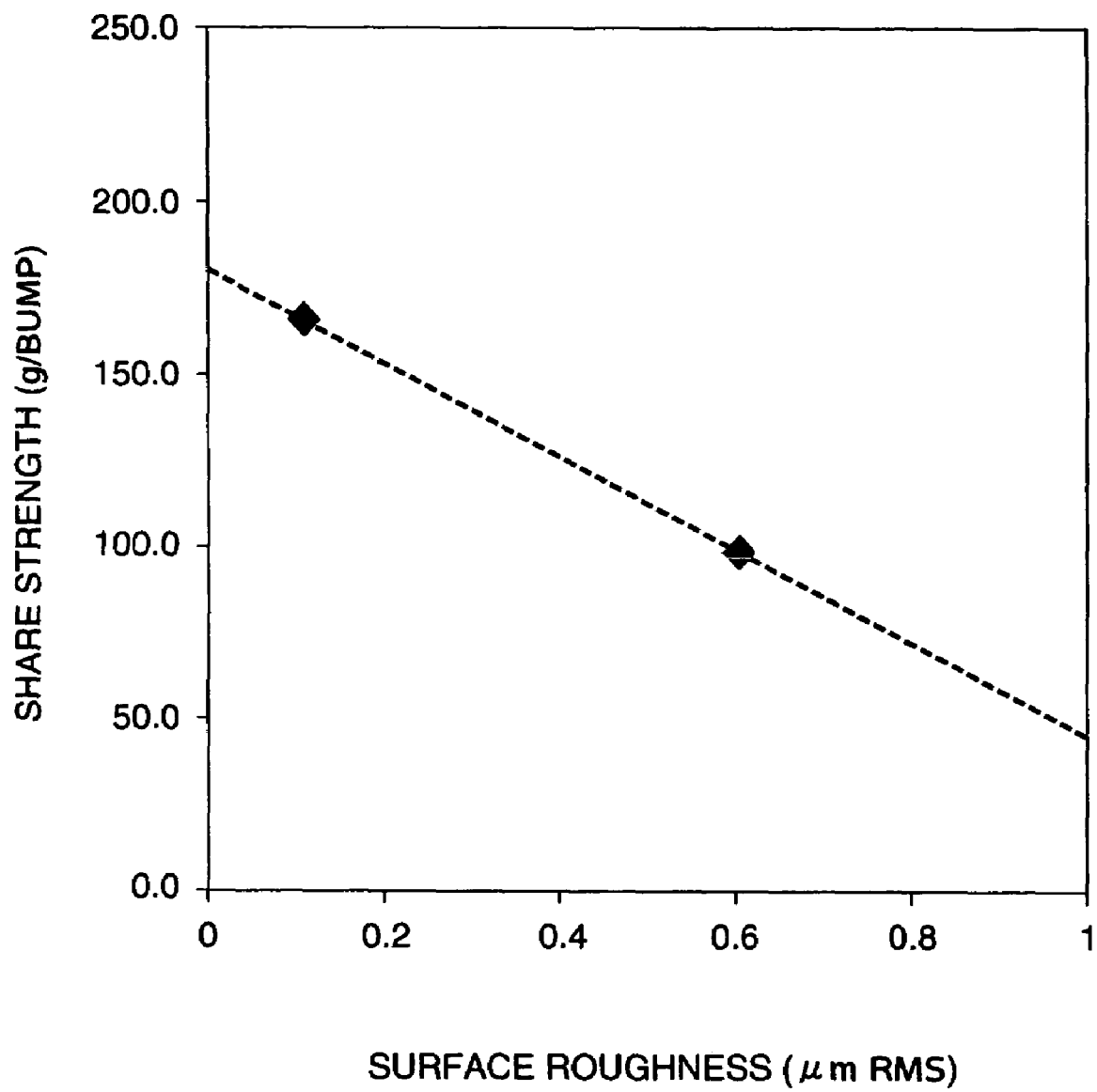
FIG. 9 is a graph for showing a share-strength per one projecting electrode in a case that an SAW element is joined by a flip-chip method on a packaging substrate having the substrate electrode on which a plating layer is formed by polishing a basic portion layer.

FIG. 1 is a sectional view for schematically showing an SAW device according to a first embodiment of the present invention, in which an SAW element is contained in a package. FIG. 2 is a schematic view for showing a circuit of the SAW element illustrated in FIG. 1. FIG. 3 is a plan view for showing a part of the SAW element illustrated in FIG. 2. FIG. 4 is a sectional view for schematically showing a junction portion between a projection electrode and a substrate electrode in the SAW device illustrated in FIG. 1. FIG. 5 is a photograph of a surface of the substrate electrode on which a plating layer is formed by polishing a basic portion layer. FIG. 6 is a graph for showing a surface roughness of the substrate electrode on which a plating layer is formed by polishing a basic portion layer. FIG. 7 is a photograph of a surface of the substrate electrode on which a plating layer is formed without polishing a basic portion layer. FIG. 8 is a graph for showing a surface roughness of the substrate electrode on which a plating layer is formed without polishing a basic portion layer. FIG. 9 is a graph for showing a share-strength per one projecting electrode in a case that an SAW element is joined by a flip-chip method on a packaging substrate having the substrate electrode on which a plating layer is formed by polishing a basic portion layer.

An SAW device 10 illustrated in FIG. 1 comprises an SAW element (integrated circuit element) 11 and a packaging substrate 12. The SAW element (integrated circuit element) 11 has a piezoelectric substrate (an element substrate), a predetermined conductive pattern and projecting electrodes 13 formed on the piezoelectric substrate (element substrate). The packaging substrate 12 is made of ceramics, such as LTCC (Low Temperature Cofired Ceramics), alumina, and the like, and is composed of a single layer or a plurality of layers. Predetermined wiring patterns and circuit patterns are formed on the packaging substrate 12. Besides, the packaging substrate 12 may be made of resin alternatively. Further, if the packaging substrate 12 is made of ceramics, any other materials other than LTCC and alumina may be used as the kind of the substrate member.

In addition, a surface on which the predetermined conductive patterns are formed in the SAW element 11 is located opposite to the packaging substrate 12. As illustrated in FIG. 1, the SAW element 11 is connected on an element mounting surface of the packaging substrate 12 by the flip-chip method through the projecting electrodes 13. In the packaging substrate 12, substrate electrodes 12a are formed on the element mounting surface on which the SAW element 11 is to be mounted. On a terminal forming surface positioned at the reverse side of the element mounting surface, external connecting terminals 12b are formed to be electrically connected with a mother board (mounting substrate) [not shown].

Herein, the piezo electric substrate is formed by a piezoelectric single crystal, such as $LiNbO_3$, $LiTaO_3$, crystal, and the like, or formed by piezo-electric ceramics, such as lead titanate zirconate piezo-electric ceramics. Alternatively, an insulating substrate on which a piezo-electric thin film, such as a ZnO thin film, and the like is formed may be used as the piezo-electric substrate. Further, a cap 14 which is made of ceramics or a metal is adhered to the packaging substrate 12 with the SAW element 11 being surrounded by the cap 14. The SAW element 11 is thereby protected from dust or mechanical impact.

As illustrated in FIG. 2, exciting electrode portions 15 each of which resonates a surface acoustic wave of a predetermined frequency are formed on such a piezo-electric substrate of the SAW element 11 mounted on the packaging substrate 12. An input electrode 16, an output electrode 17 and ground electrodes 18, as element electrodes, which electrically connect the exciting electrode portions 15 with the packaging substrate 12 and through which an electric signal to the exciting electrode portions 15 is inputted or outputted are electrically connected to the exciting electrode portions 15 through wirings 19. The wirings 19 electrically connect the exciting electrode portions 15 with the input electrode 16, the output electrode 17 and the ground electrodes 18. In addition, the wirings 19 electrically connect the exciting electrode portions 15 with each other.

The exciting electrode portions 15 and the wirings 19 are made of aluminum or aluminum alloy. However, materials other than the aluminum or the aluminum alloy may be contained in the exciting electrode portions 15 and the wirings 19. Besides, projecting electrodes 13 composed, for example, of gold (Au) shown in FIG. 1 are formed on the input electrode 16, the output electrode 17 and the ground electrodes 18. The projecting electrodes 13 and the substrate electrodes 12a formed on the packaging substrate 12 are connected to each other by using ultrasonic waves, so that the SAW element 11 is mounted on the packaging substrate 12. Alternatively, the projecting electrodes 13 may be composed of a material other than gold (Au), such as aluminum (Al), or the like. Herein, each of the exciting electrode portions 15 has a shape of the teeth of a comb with being involved in each other, as illustrated in FIG. 3. With the structure, by applying voltage on the exciting electrode portions 15 of the input side to be subjected to an electric field, a surface acoustic wave (SAW) is produced on the piezo-electric substrate by piezo-electric effects. On the other hand, mechanical strain due to thus produced surface acoustic wave (SAW) generates an electric field to be converted into an electric signal by the exciting electrode portions 15 of the output side. At the both sides of each exciting electrode portion 15, reflectors 20 are located to reflect the surface acoustic wave (SAW).

In this embodiment, the wirings 19 between the input electrode 16 and the output electrode 17 is formed to be a serial arm. Further, a plurality of parallel arms that are the wirings 19 are formed between the serial arm and the ground electrodes 18. Accordingly, the exciting electrode portions 15 are located in the serial arm and the parallel arms to constitute an RADA-type circuit. However, the other constitutions of a circuit can be used.

As illustrated in FIG. 4, the substrate electrode 12a comprises a basic portion layer 21 and plating layers. The basic portion layer 21 is composed, for example, of silver (Ag) or copper (Cu) formed on the substrate member of the packaging substrate 12. The plating layers are composed, for example, of a nickel (Ni) plating layer 22 and a gold (Au) plating layer 23 both stacked and formed one by one on the basic portion layer 21. The substrate electrode 12a thus mentioned are used as signal line electrodes or ground electrodes. Besides, the plating layers may be alternatively composed, for example, of a nickel (Ni) plating layer and a tin (Sn) plating layer both stacked and formed one by one on the basic portion layer 21. Other combination of the plating layers may also be alternative.

Herein, in a process of forming the substrate electrodes 12a of the packaging substrate 12 in this embodiment, after the basic portion layer 21 is formed, a surface of the basic portion layer 21 is polished by barrel polishing method. As a result, surface roughness of the substrate electrodes 12a after the plating process is not larger than 0.1 $\mu$m. However, it is not always necessary that the surface roughness of the substrate electrodes 12a after the plating process is not larger than 0.1 $\mu$mRMS. It is enough that the basic portion layer 21 is subjected to polishing to be flattened. Alternatively, the surface of the basic portion layer 21 may be polished by lapping (polishing) method.

FIG. 5 shows a photograph of a surface of the substrate electrodes 12a on which the plating layers 22, 23 are formed after polishing the basic portion layer 21. FIG. 6 shows a graph for showing a surface roughness of the substrate electrodes 12a on which the plating layers 22, 23 are formed after polishing the basic portion layer 21. On the other hand, as comparative examples, FIG. 7 shows a photograph of a surface of the substrate electrodes 12a on which the plating layers 22, 23 are formed without polishing the basic portion layer 21. FIG. 8 shows a graph for showing a surface roughness of the substrate electrodes 12a on which the plating layers 22, 23 are formed without polishing the basic portion layer 21.

As illustrated in FIG. 5, a surface condition of an electrode material of the substrate electrode 12a on which the plating layers 22, 23 are formed after polishing the basic portion layer 21 is apparently different from that of the substrate electrode 12a on which the plating layers 22, 23 are formed without polishing the basic portion layer 21. Namely, grains of the electrode material and unevenness by the glass components mixed in the electrode material can be observed in the substrate electrode 12a for which the polishing is not conducted (shown in FIG. 7). On the contrary, although a little unevenness are seen in side surfaces of the peripheral portion, the substrate electrode 12a for which the polishing has been conducted (shown in FIG. 5) can be observed to be much flattened. As a result, as regards an optical recognition ratio of the electrode patterns, it is never possible to optically recognize the electrode patterns, when the polishing is not conducted. On the other hand, one hundred percentages of the optical recognition ratio can be achieved, when the polishing has been conducted.

Further, surface roughness of the substrate electrode 12a for which the polishing has been conducted is largely improved, as illustrated in FIG. 6, compared with that for which the polishing is not conducted shown in FIG. 8. The surface roughness of the substrate electrode 12a for which the polishing is not conducted (FIG. 8) is about 0.6 $\mu$mRMS and ranges approximately 3 $\mu$m. Further, large grains each having a diameter of approximately 20 $\mu$m were confirmed. It is supposed that the glass components positioned in a surface are combined to produce the large grains. Subsequently, in a case that projecting electrodes each having a diameter of approximately 100 $\mu$m are joined to the substrate electrode 12a having such a large surface roughness, share-strength of each projecting electrode becomes completely weak.

On the other hand, the surface roughness of the substrate electrode 12a for which the polishing has been conducted in the present invention (FIG. 6) is far improved, as the surface roughness thereof is not larger than 0.1 $\mu$mRMS and ranges approximately 0.4 $\mu$m. In FIG. 9, depicted is a share-strength per one projecting electrode, in a case that the SAW element 11 is joined by a flip-chip method on the packaging substrate 12 having such a substrate electrode 12a in the present invention. As will be understood from FIG. 9, the smaller a surface roughness of the substrate electrode 12a is, the larger a share-strength per one projecting electrode becomes. In addition, when the surface roughness of the substrate electrode 12a is 0.1 $\mu$mRMS, the share-strength per one projecting electrode is about 166 g. Besides, the surface roughness of the substrate electrode 12a is 0.6 $\mu$mRMS, when the polishing is not conducted as mentioned above. The share-strength per one projecting electrode is then about 100 g.

Next, description will proceed to a method of manufacturing an SAW device having such a composition.

In the method, at first, the basic portion layer 21 of the substrate electrode 12a is formed by a printing technique on the substrate member that is a material of the packaging substrate 12. In this embodiment, since the packaging substrate 12 is made of ceramics, the substrate member on which the basic portion layer 21 is formed is then subjected to sintering. After the sintering, the surface of the basic portion layer 21 is polished, for example, by barrel polishing method. At this time, the polishing of the surface of the basic portion layer 21 is carried out so that the surface roughness of the substrate electrode 12a after the plating layers hereunder described would be formed thereon may be, for example, not larger than 0.1 $\mu$mRMS. After the polishing has been carried out, for example, the nickel (Ni) plating layer 22 and the gold (Au) plating layer 23 are stacked and formed one by one on the basic portion layer 21. Herein, the plating layers 22 and 23 are formed so as to improve corrosion resistance, soldering characteristics, junction stability of the projecting electrode, or the like. After forming the plating layers 22 and 23, the packaging substrate 12 is set on a stage (not shown) with an element mounting surface thereof being directed to the outside. Ultrasonic wave vibrations are applied to the SAW element 11 with the projecting electrodes 13 and the substrate electrodes 12a corresponding thereto being kept in contact with each other. The SAW element 11 is thereby joined to the element mounting surface of the packaging substrate 12. The projecting electrodes 13 and the substrate electrodes 12a are then connected to each other electrically and mechanically. After the SAW element 11 has been joined to the element mounting surface of the packaging substrate 12, the cap 14 is adhered on the packaging substrate 12 with the SAW element 11 being surrounded by the cap 14. As a result, the SAW element 11 is sealed.

Thus, according to this embodiment, since the plating layers 22 and 23 are formed after the surface of the basic portion layer 21 of the substrate electrode 12a has been polished, the surface roughness of the substrate electrode 12a is largely improved. It therefore becomes possible to improve junction strength of the SAW element 11 mounted on the packaging substrate 12 by the flip-chip method. In addition, since the surface roughness of the substrate electrode 12a is thus improved, high frequency characteristics of the SAW element 11 is also improved. If the basic portion layer 21 is formed by silver (Ag) or copper (Cu), a thickness of a surface layer for 2 GHz is about 1.4 μm. As a result, when the basic portion layer 21 is not polished, a conduction ratio becomes approximately 70%. On the other hand, when the basic portion layer 21 has been polished, the surface roughness of the substrate electrode 12a is improved. The conduction ratio thereby becomes close to 100%.

Besides, the above description was made about the SAW device 10 on which only one SAW element 11 is mounted. The present invention can be applied to various types of SAW devices. For example, two SAW elements 11 having center frequencies different from each other may be mounted on the SAW device to produce a branching filter. Further, the present invention is not restricted to such an SAW device. The present invention can be applied to various integrated circuit devices each of in which an integrated circuit element having an element substrate, such as a piezo-electric substrate, a silicon substrate, and the like and a predetermined circuit pattern formed on the element substrate is mounted on a packaging substrate. Besides, as an example of such an integrated circuit device, considered are a power amplifier, a front end module for a portable terminal equipment, a temperature compensation type crystal oscillator, a voltage control crystal oscillator, a semiconductor integrated circuit device for high frequency, a multi-chip module for high frequency, and the like.

As will be clearly understood from the above description, the following advantageous effects can be obtained according to the present invention. Since the plating layers are formed after the surface of the basic portion layer of the substrate electrode has been polished, the surface roughness of the substrate electrode is largely improved. It therefore becomes possible to improve share-strength of an integrated circuit element mounted on the packaging substrate by the flip-chip method. Consequently, it is also possible to reduce poor junction of the integrated circuit element. In addition, since the surface roughness of the substrate electrode is thus improved, high frequency characteristics of the device is also improved.

Figure 10:
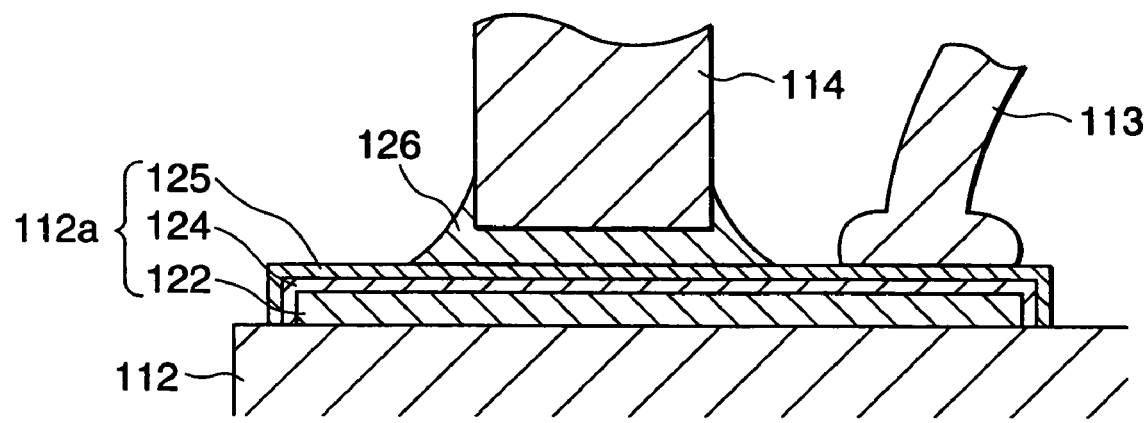
FIG. 10 is a sectional view for schematically showing a characterizing portion of a conventional SAW device.

Now, referring to FIG. 10, description is made about a conventional SAW device in order to facilitate an understanding of the next embodiment of the present invention. FIG. 10 shows a sectional view for schematically showing a characterizing portion of the conventional SAW device. As illustrated in FIG. 10, a substrate electrode 112a to which an end of a bonding wire 113 is connected is formed on a packaging substrate 112 made of, for example, ceramics. The substrate electrode 112a comprises a basic portion layer 122 and plating layers. The basic portion layer 122 is composed, for example, of silver (Ag) or copper (Cu). The plating layers are composed, for example, of a nickel (Ni) plating layer 124 and a gold (Au) plating layer 125 both stacked one by one on the basic portion layer 122.

Further, an adhesive 126 made of resin are painted on the plating layers 124 and 125. A cap (sealing member) 114 hermetically sealing the SAW element mounted on the packaging substrate 112 is adhered on the packaging substrate 112 through the adhesive 126.

In the SAW device having a structure thus mentioned, the adhesive 126 are painted circularly on an area to be adhered to the cap 114. As a result, the adhesive 126 are also painted not only on the substrate electrode but also on a surface of the packaging substrate 112 in which the substrate electrode is not formed. Herein, although the adhesive 126 made of resin can be adhered to the packaging substrate 112 of ceramics itself with a large adhering strength, the adhesive 126 made of resin cannot be adhered to a metal, such as the plating layers 124, 125, the substrate electrode, or the like with such a large adhering strength. Therefore, the cap 114 adhered to the packaging substrate 112 by the adhesive 126 can be adhered at a sufficiently large strength to a portion in which the substrate electrode is not formed. However, the cap 114 adhered to the packaging substrate 112 by the adhesive 126 cannot be adhered at a desirable strength to a portion in which the substrate electrode is formed. As a result, water invades from a portion between the substrate electrode and the adhesive 126 into the SAW device. Accordingly, reliability as the SAW device is so damaged. This problem is caused to occur not only in the SAW device but also in every integrated circuit device that an integrated circuit element is mounted on a packaging substrate. Accordingly, description will proceed to an embodiment of the present invention that can solve this problem.

Figure 11:
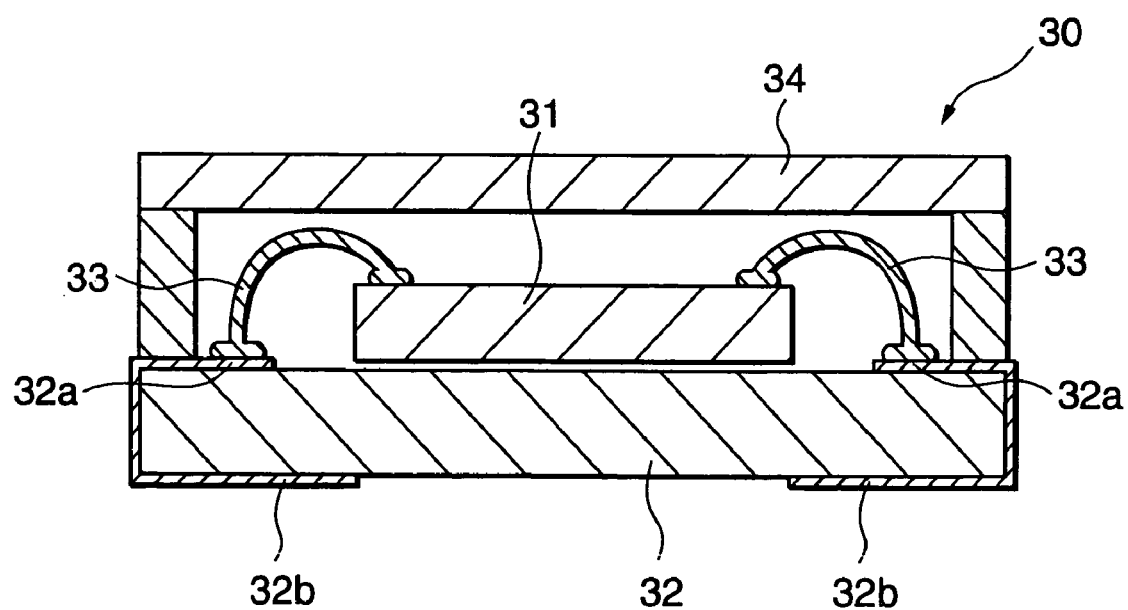
FIG. 11 is a sectional view for schematically showing an SAW device according to a second embodiment of the present invention, in which an SAW element is contained in a package.
Figure 12:
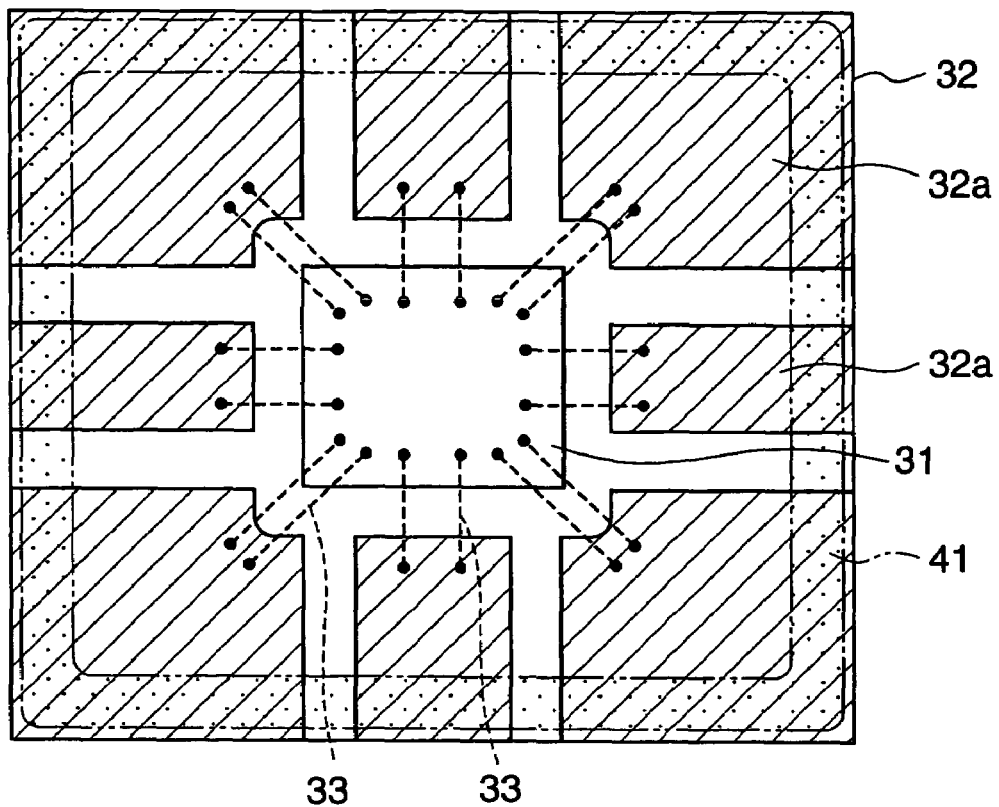
FIG. 12 is a plan view for showing the packaging substrate with the SAW element of the SAW device illustrated in FIG. 11.
Figure 13:
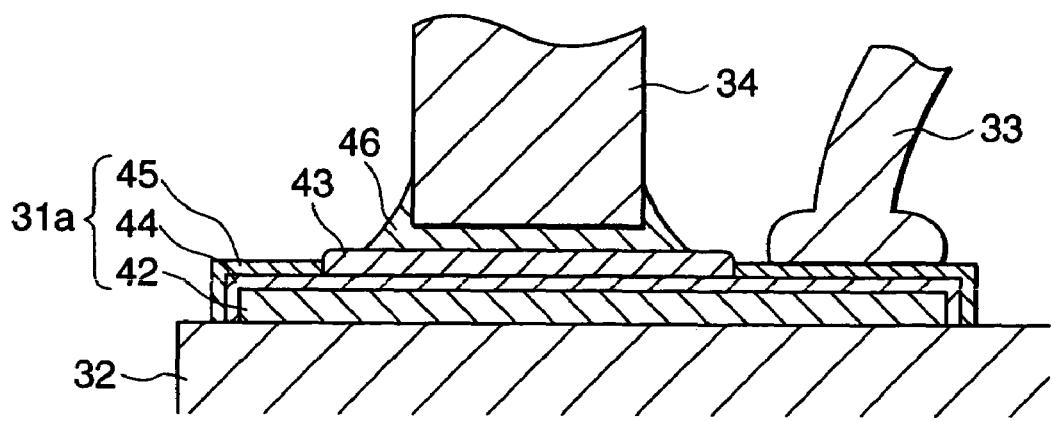
FIG. 13 is a sectional view for schematically showing a characterizing portion of the SAW device illustrated in FIG. 11.
Figure 14:
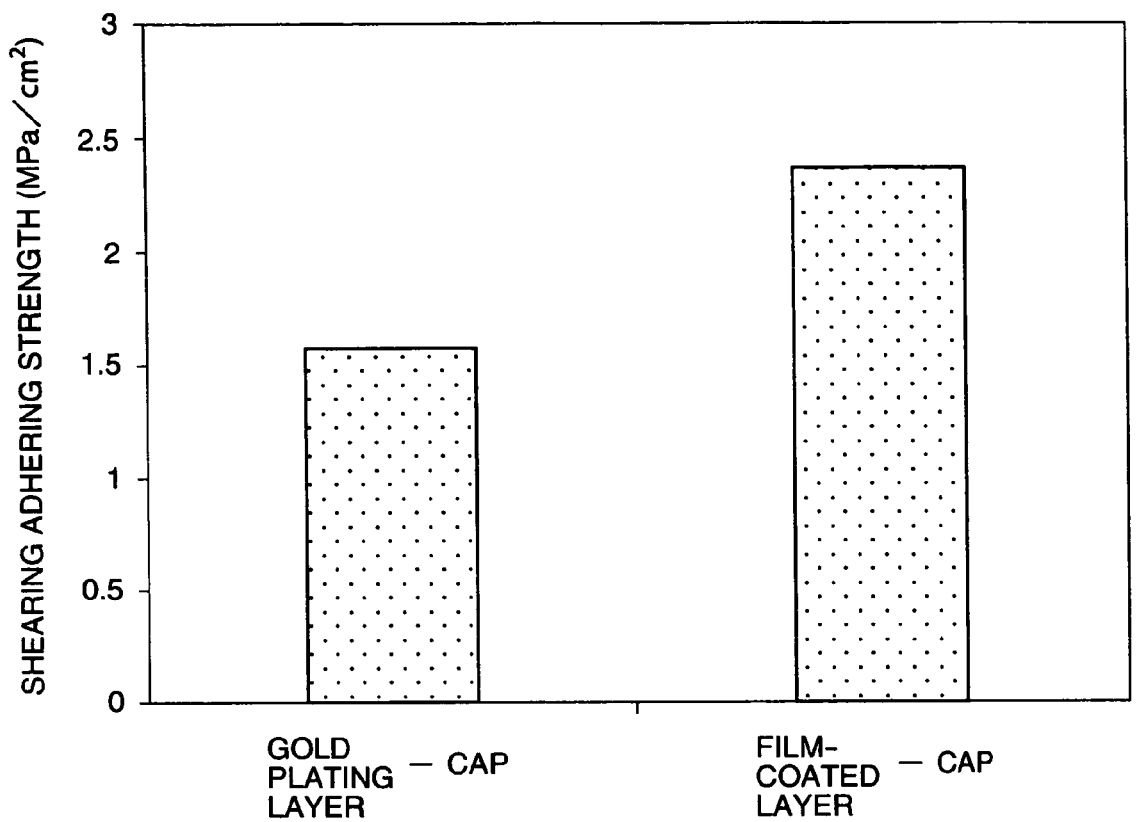
FIG. 14 is a graph for showing a shearing adhesive strength of a cap to the packaging substrate.

FIG. 11 is a sectional view for showing an SAW device according to a second embodiment of the present invention, in which an SAW element is contained in a package. FIG. 12 is a plan view for showing the packaging substrate with the SAW element of the SAW device illustrated in FIG. 11. FIG. 13 is a sectional view for showing a characterizing portion of the SAW device illustrated in FIG. 11. FIG. 14 is a graph for showing a shearing adhesive strength of a cap to the packaging substrate.

An SAW device 30 illustrated in FIG. 11 comprises an SAW element (integrated circuit element) 31 and a packaging substrate 32. The SAW element (integrated circuit element) 31 has a piezoelectric substrate (an element substrate), a predetermined conductive pattern and projecting electrodes 13 formed on the piezoelectric substrate (element substrate). The packaging substrate 32 is made of ceramics, such as LTCC (Low Temperature Cofired Ceramics), alumina, and the like, and is composed of a single layer or a plurality of layers. Predetermined wiring patterns and circuit patterns are formed on the packaging substrate 32. Besides, the packaging substrate 32 may be made of resin alternatively. Further, if the packaging substrate 32 is made of ceramics, any other materials other than LTCC and alumina may be used as the kind of the substrate member.

In addition, a surface on which the predetermined conductive patterns are formed in the SAW element 31 is located opposite to the packaging substrate 32. In other words, a surface opposite to the surface on which the predetermined conductive patterns are formed in the SAW element 31 is adhered on an element mounting surface of the packaging substrate 32. In the packaging substrate 32, substrate electrodes 32a are formed on the element mounting surface while external connecting terminals 32b to be electrically connected with a mother board (mounting substrate) [not shown] are formed on a terminal forming surface positioned at the reverse side of the element mounting surface.

Further, as illustrated in FIG. 11, element electrodes of the SAW element 31 and the substrate electrodes 32a of the packaging substrate 32 are electrically connected with each other by bonding wires 33. Besides, the SAW element 31 and the packaging substrate 32 may be alternatively connected with each other by the flip-chip method through projecting electrodes. Herein, the piezo-electric substrate is formed by a piezo-electric single crystal, such as $LiNbO_3$, $LiTaO_3$, crystal, and the like, or formed by piezo-electric ceramics, such as lead titanate zirconate piezo-electric ceramics. Alternatively, an insulating substrate on which a piezo-electric thin film, such as a ZnO thin film, and the like is formed may be used as the piezo-electric substrate.

As illustrated in FIGS. 12 and 13, the element mounting surface of the packaging substrate 32 has a cap adhering area (sealing member adhering area) 41 which is defined by a portion on the substrate electrodes 32a and a portion of a lower member of the packaging substrate 32. A film-coated layer 43 of, for example, a glass material of $SiO_2$ and the like is formed circularly in the cap adhering area (sealing member adhering area) 41. Further, an adhering agent 46 made of, for example, resin is painted on the film-coated layer 43. The cap (sealing member) 34 is adhered on the packaging substrate 32 through the adhering agent 46. The cap 34 hermetically seals the SAW element 31. The SAW element 31 is thereby protected from mechanical impact as well as external environment, such as dust, humidity, or the like.

Herein, "circularly" in this specification has a meaning that the whole of the film-coated layer 43 is formed endlessly, namely, is endless. The whole of the film-coated layer 43 may be any shapes. Further, it is not necessary that a width of the film-coated layer 43 is uniform anywhere. Besides, for example, a member used as a solder resist can be applied to the film-coated layer 43. It is not necessary that the film-coated layer 43 is formed all over the cap adhering area 41. The film-coated layer 43 may be formed with a part of the film-coated layer 43 being bulging out of the cap adhering area 41.

Epoxy resin or silicon resin can be used as the adhering agent 46. The adhering agent 46 in this embodiment is liquid. However, a semi-hardened one, one formed like a sheet, or the like can be alternatively used as the adhering agent 46. Besides, the adhering agent is hardened by heat. It is not necessary that the adhering agent 46 is made of resin. Besides, at first, the adhering agent 46 is painted on the side of the film-coated layer 43 and the film-coated layer 43 is then adhered to the cap 34. On the contrary, the adhering agent 46 is painted on the side of the cap 34 and the cap 34 is then adhered to the film-coated layer 43 together with the adhering agent 46. In addition, the cap 34 may be made, for example, of ceramics or metal. More concretely, the cap 34 can be formed by ceramics, ceramics with a nickel (Ni), a tin (Sn), a gold (Au), and the like being plated thereon, or a metal.

As illustrated in FIG. 13, the substrate electrode 32a comprises a basic portion layer 42 and plating layers 44, 45. The basic portion layer 42 which is composed, for example, of silver (Ag) or copper (Cu) and in which a glass material is mixed is joined with the film-coated layer 43 consisting partially of a glass material. The plating layers 44, 45 are formed in an area except the area of the film-coated layer 43 on the basic portion layer 42. The substrate electrode 32a thus mentioned are used as signal line electrodes or ground electrodes. Besides, the film-coated layer 43 is formed by printing at the same time as sintering of the substrate electrode 32a in this embodiment. Further, the plating layers are composed, for example, of a nickel (Ni) plating layer 44 and a gold (Au) plating layer 45 both stacked and formed one by one on the basic portion layer 42. Besides, the plating layers may be alternatively composed, for example, of a nickel (Ni) plating layer and a tin (Sn) plating layer.

With the structure, glass materials are contained in both the substrate electrode 32a and the film-coated layer 43 joined to each other, the both are strongly adhered to each other. Further, the film-coated layer 43 including such a glass material and the adhering agent 46 are also strongly adhered to each other. As a result, the cap 34 adhered by the adhering agent 46 comes to be adhered on the substrate electrode 32a, namely, on the packaging substrate 32 by a large adhering strength.

Herein, in FIG. 14, illustrated is a shearing adhesive strength of the cap 34 to the packaging substrate 32. Besides, in FIG. 14, the cap 34 made of ceramics is used. In FIG. 14, the adhesive strength in a case that the cap 34 and the film-coated layer 43 are adhered through the adhering agent 46 is shown, compared with an adhesive strength in a case that a cap and a gold-plated layer are adhered through an adhering agent (shown in FIG. 15).

As illustrated in FIG. 14, the film-coated layer 43 consisting partially of a glass material is formed on the substrate electrode 32a in which the glass material is mixed. The cap 34 is then adhered on the film-coated layer 43 by the use of the adhering agent 46. The adhering strength of the cap 34 is thereby largely improved. Further, since the adhering strength is so largely improved, the SAW element 31 sealed by the cap 34 is prevented from being invaded by water. As a result, reliability of the SAW device 30 can be achieved.

Besides, in this embodiment, the basic portion layer 42 is mixed with a glass material. The film-coated layer 43 consisting partially of a glass material is then formed on the basic portion layer 42 mixed with the glass material. Alternatively, the glass material is mixed, for example, into the gold-plating layer 45, and the film-coated layer 43 consisting partially of the glass material is then formed on the gold-plating layer 45. Namely, it is enough that the film-coated layer 43 is formed on a conductive material mixed with a glass material within the substrate electrode 32a. Kinds of the conductive materials constituting the substrate electrode 32a or patterns of constitution of the substrate electrode 32a mentioned above are not restricted to those of this embodiment.

A circuit similar to that of FIG. 2 is formed on a piezo-electric substrate of the SAW element 31 mounted on such an SAW device 30. Namely, exciting electrode portions 15 each of which resonates a surface acoustic wave of a predetermined frequency are formed on such a piezo-electric substrate of the SAW element 31. An input electrode 16, an output electrode 17 and ground electrodes 18, as element electrodes, which electrically connect the exciting electrode portions 15 with the packaging substrate 32 and through which an electric signal to the exciting electrode portions 15 is inputted or outputted are electrically connected to the exciting electrode portions 15 through wirings 19. The wirings 19 electrically connect the exciting electrode portions 15 with the input electrode 16, the output electrode 17 and the ground electrodes 18. In addition, the wirings 19 electrically connect the exciting electrode portions 15 with each other.

The exciting electrode portions 15 and the wirings 19 are made of aluminum or aluminum alloy. However, materials other than the aluminum or the aluminum alloy may be contained in the exciting electrode portions 15 and the wirings 19.

Herein, each of the exciting electrode portions 15 has a shape of the teeth of a comb with being involved in each other, as illustrated in FIG. 3. With the structure, by applying voltage on the exciting electrode portions 15 of the input side to be subjected to an electric field, a surface acoustic wave (SAW) is produced on the piezo-electric substrate by piezo-electric effects. On the other hand, mechanical strain due to thus produced surface acoustic wave (SAW) generates an electric field to be converted into an electric signal by the exciting electrode portions 15 of the output side. At the both sides of each exciting electrode portion 15, reflectors 20 are located to reflect the surface acoustic wave (SAW).

In this embodiment, the wirings 19 between the input electrode 16 and the output electrode 17 is formed to be a serial arm. Further, a plurality of parallel arms that are the wirings 19 are formed between the serial arm and the ground electrodes 18. Accordingly, the exciting electrode portions 15 are located in the serial arm and the parallel arms to constitute an RADA-type circuit. However, the other constitutions of a circuit can be used.

As described above, in the SAW device of this embodiment, the film-coated layer 43 of a glass material is formed on the substrate electrode 32a in which a glass material is mixed. Both the film-coated layer 43 and the substrate electrode 32a are thereby strongly adhered to each other. Further, the cap 34 is adhered on the packaging substrate 32 through the adhering agent 46 positioned on the film-coated layer 43. It is therefore possible to largely improve adhering strength of the cap 34 to the packaging substrate 32.

Besides, the above description was made about the SAW device 30 on which only one SAW element 31 is mounted. The present invention can be applied to various types of SAW devices. For example, two SAW elements having center frequencies different from each other may be mounted on the SAW device to produce a branching filter. Further, the present invention is not restricted to such an SAW device. The present invention can be applied to various integrated circuit devices each of in which an integrated circuit element having an element substrate, such as a piezo-electric substrate, a silicon substrate, and the like and a predetermined circuit pattern formed on the element substrate is mounted on a packaging substrate.

As will be clearly understood from the above description, the following advantageous effects can be obtained according to the present invention. The film-coated layer of a glass material is formed on the substrate electrode in which a glass material is mixed. Both the film-coated layer and the substrate electrode are thereby strongly adhered to each other. Further, the sealing member is adhered on the packaging substrate through the adhering agent positioned on the film-coated layer. It is therefore possible to largely improve adhering strength of the sealing member to the packaging substrate. Further, since the adhering strength is so largely improved, the integrated circuit element sealed by the sealing member is prevented from being invaded by water. As a result, reliability of the integrated circuit device can be achieved.

Figure 15:
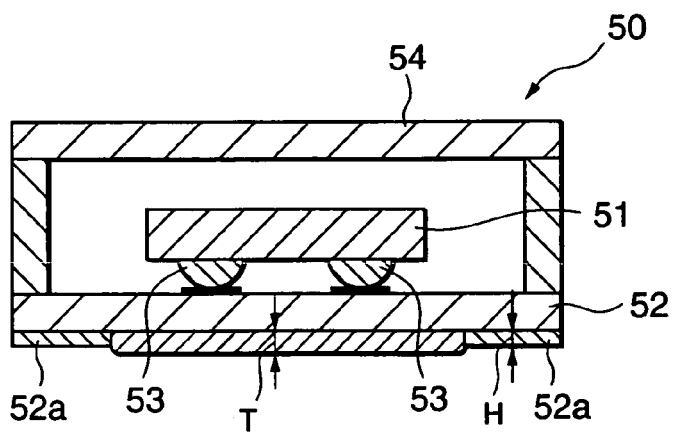
FIG. 15 is a sectional view for schematically showing an SAW device according to a third embodiment of the present invention, in which an SAW element is contained in a package.
Figure 16:
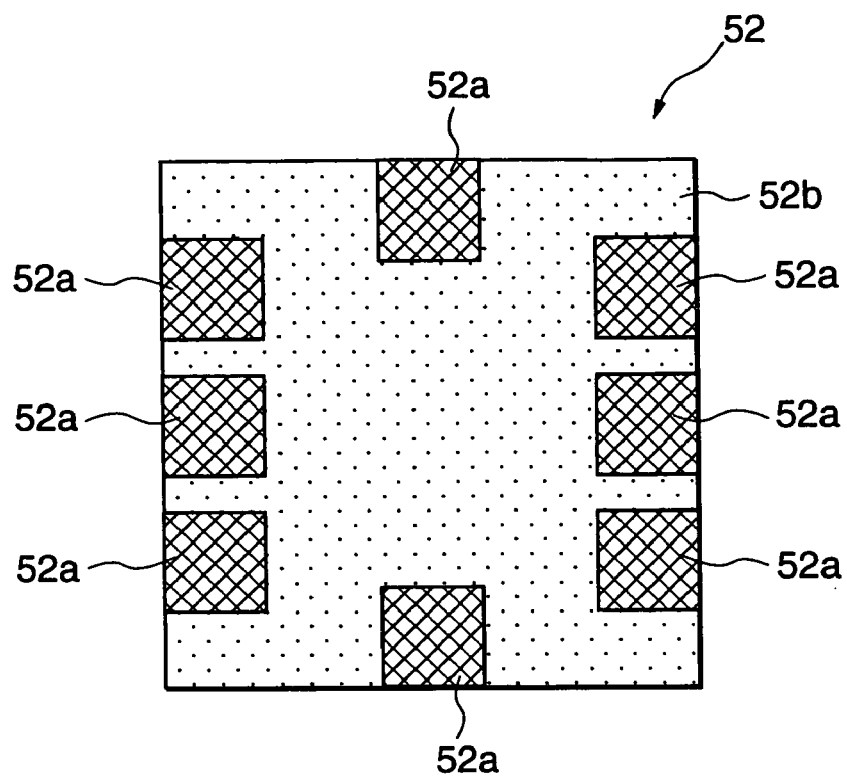
FIG. 16 is a plan view for showing the packaging substrate from a terminal forming surface of the SAW device illustrated in FIG. 15.
Figure 17:
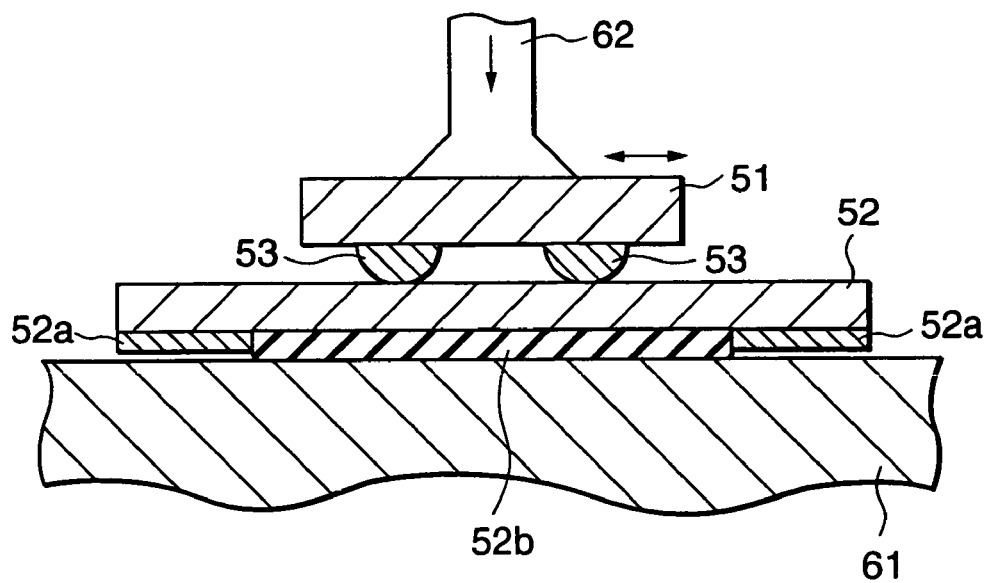
FIG. 17 is an explanation view for schematically showing a condition of the ultrasonic wave mounting in the SAW device illustrated in FIG. 15.
Figure 18:
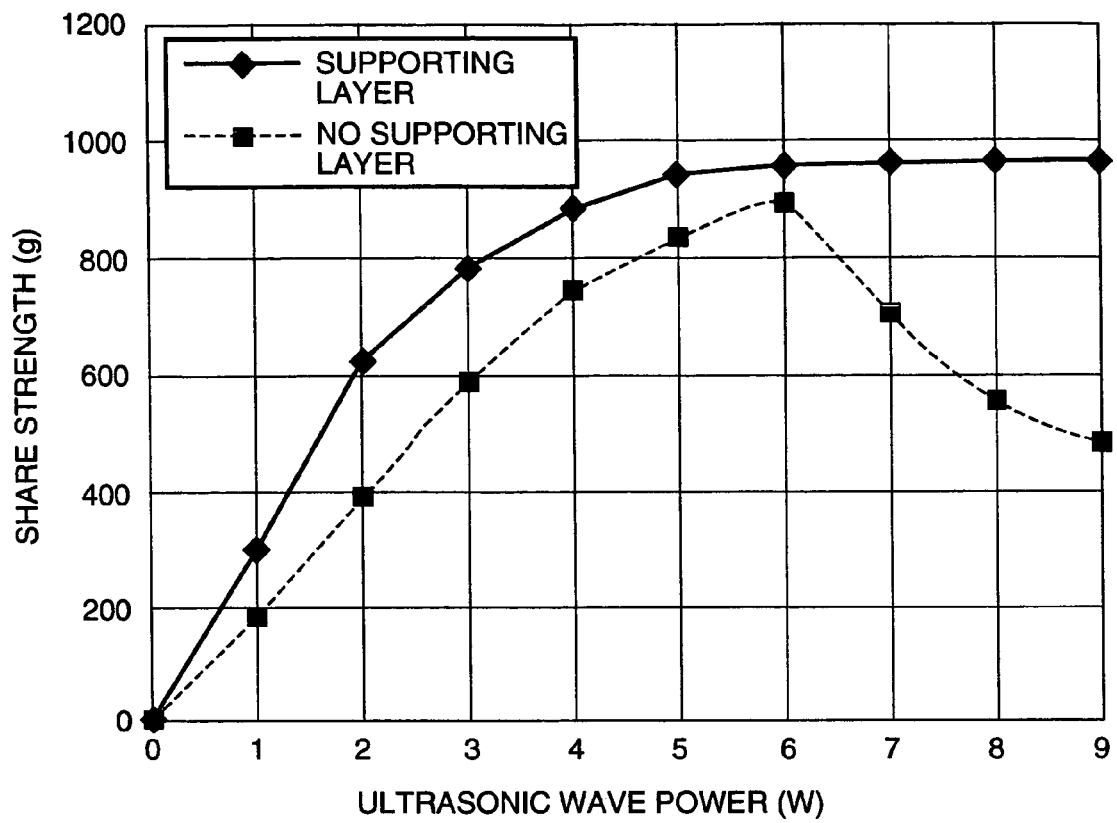
FIG. 18 is a graph for showing a relation between an ultrasonic wave power and share-strength in the SAW device illustrated in FIG. 15 with a comparative example.
Figure 19:
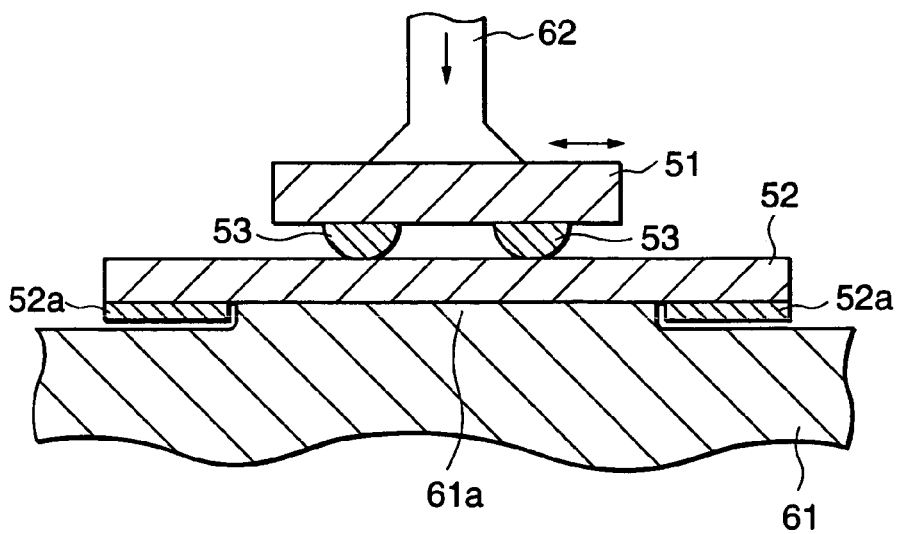
FIG. 19 is an explanation view for schematically showing a condition of the ultrasonic wave mounting in the SAW device according to a fourth embodiment of the present invention.

FIG. 15 is a sectional view for showing an SAW device according to a third embodiment of the present invention, in which an SAW element is contained in a package. FIG. 16 is a plan view for showing the packaging substrate from a terminal forming surface of the SAW device illustrated in FIG. 15. FIG. 17 is an explanation view for showing a condition of the ultrasonic wave mounting in the SAW device illustrated in FIG. 15. FIG. 18 is a graph for showing a relation between an ultrasonic wave power and share-strength in the SAW device illustrated in FIG. 15 with a comparative example. FIG. 19 is an explanation view for showing a condition of the ultrasonic wave mounting in the SAW device according to a fourth embodiment of the present invention.

An SAW device 50 illustrated in FIG. 15 comprises an SAW element (integrated circuit element) 51 and a packaging substrate 52. The SAW element (integrated circuit element) 51 has a piezoelectric substrate (an element substrate), a predetermined conductive pattern and projecting electrodes 53 formed on the piezoelectric substrate (element substrate). The packaging substrate 52 is made of resin and is composed of a single layer or a plurality of layers. Predetermined wiring patterns and circuit patterns are formed on the packaging substrate 52. In addition, a surface on which the predetermined conductive patterns are formed in the SAW element 51 is located opposite to the packaging substrate 52. As illustrated in FIG. 15, the SAW element 51 is connected on an element mounting surface of the packaging substrate 52 by the flip-chip method through the projecting electrodes 53. In the packaging substrate 52, external connecting terminals 52a to be electrically connected with a mother board (mounting substrate) [not shown] are formed on a terminal forming surface positioned at the reverse side of the element mounting surface. Further, as illustrated in FIGS. 15 and 16, a supporting layer 52b having a thickness T that is larger than a height H of the external connecting terminals 52a is formed in an area other than the area in which the external connecting terminals 52a are formed. It is enough that, on the reverse side of the packaging substrate 52, the supporting layer 52b is formed in an area corresponding to a range of mounting the SAW element 51. In this embodiment, the supporting layer 52b is formed in all the area except that the external connecting terminals 52a are formed. However, it is not necessary that the supporting layer 52b is formed in all the area except that the external connecting terminals 52a are formed. On the other hand, it is, of course, necessary that the supporting layer 52b is formed to avoid the external connecting terminals 52a. The supporting layer 52b is never formed to be overlaid on the external connecting terminals 52a.

Herein, from the view point of preventing the external connecting terminals 52a and the conductive patterns formed on the terminal forming surface of the packaging substrate 52 from being electrically connected by the supporting layer 52b, the supporting layer 52b is composed of an insulating member, such as solder resist, or the like. However, in a case that the supporting layer 52b is formed not to be kept in contact with the external connecting terminals 52a and the conductive patterns, it is not necessary that the supporting layer 52b is composed of an insulating member. Further, it is enough that the thickness T of the supporting layer 52b is not smaller than the height H of the external connecting terminals 52a. Namely, the thickness T of the supporting layer 52b may be equal to the height H of the external connecting terminals 52a. Of course, the thickness T of the supporting layer 52b may be larger than the height H of the external connecting terminals 52a.

Herein, the piezo-electric substrate is formed by a piezo-electric single crystal, such as $LiNbO_3$, $LiTaO_3$, crystal, and the like, or formed by piezo-electric ceramics, such as lead titanate zirconate piezo-electric ceramics. Alternatively, an insulating substrate on which a piezo-electric thin film, such as a ZnO thin film, and the like is formed may be used as the piezo-electric substrate. Further, a cap (sealing member) 54 for hermetically sealing the SAW element 51 is adhered to the packaging substrate 52. The SAW element 51 is thereby protected from dust or mechanical impact. Besides, the SAW element 51 may be sealed by resin.

A circuit similar to that of FIG. 2 is formed on a piezo-electric substrate of the SAW element 51 mounted on such an SAW device 50. Namely, exciting electrode portions 15 each of which resonates a surface acoustic wave of a predetermined frequency are formed on such a piezo-electric substrate of the SAW element 31. An input electrode 16, an output electrode 17 and ground electrodes 18, as element electrodes, which electrically connect the exciting electrode portions 15 with the packaging substrate 32 and through which an electric signal to the exciting electrode portions 15 is inputted or outputted are electrically connected to the exciting electrode portions 15 through wirings 19. The wirings 19 electrically connect the exciting electrode portions 15 with the input electrode 16, the output electrode 17 and the ground electrodes 18. In addition, the wirings 19 electrically connect the exciting electrode portions 15 with each other.

The exciting electrode portions 15 and the wirings 19 are made of aluminum or aluminum alloy. However, materials other than the aluminum or the aluminum alloy may be contained in the exciting electrode portions 15 and the wirings 19. Besides, the projecting electrodes 53 illustrated in FIG. 15 are formed on the packaging substrate 52, so that the input electrode 16, the output electrode 17, the ground electrodes 18 and the packaging substrate 52 are connected to each other through the bumps of the projecting electrodes 53 by using ultrasonic waves.

Herein, each of the exciting electrode portions 15 has a shape of the teeth of a comb with being involved in each other, as illustrated in FIG. 3. With the structure, by applying voltage on the exciting electrode portions 15 of the input side to be subjected to an electric field, a surface acoustic wave (SAW) is produced on the piezo-electric substrate by piezo-electric effects. On the other hand, mechanical strain due to thus produced surface acoustic wave (SAW) generates an electric field to be converted into an electric signal by the exciting electrode portions 15 of the output side. At the both sides of each exciting electrode portion 15, reflectors 20 are located to reflect the surface acoustic wave (SAW).

In this embodiment, the wirings 19 between the input electrode 16 and the output electrode 17 is formed to be a serial arm. Further, a plurality of parallel arms that are the wirings 19 are formed between the serial arm and the ground electrodes 18. Accordingly, the exciting electrode portions 15 are located in the serial arm and the parallel arms to constitute an RADA-type circuit. However, the other constitutions of a circuit can be used.

Next, referring to FIG. 17, description proceeds to a method of manufacturing the SAW device having such a composition. At first, the SAW element 51 and the packaging substrate 52 mentioned above are prepared. Next, the packaging substrate 52 is set on a stage 61 with the element mounting surface being directed to the outside. The supporting layer 52b and the stage 61 are then kept in contact with each other. Further, ultrasonic wave vibrations are applied to the SAW element 51 while the SAW element 51 supported by a supporting member 62 is pushed toward the supporting layer 52b. The SAW element 51 is thereby joined to the element mounting surface of the packaging substrate 52.

Besides, after the SAW element 51 has been joined to the element mounting surface of the packaging substrate 52, the cap 54 is adhered on the packaging substrate 52 with the SAW element 51 being surrounded by the cap 54. Herein, the packaging substrate 52 made of resin is prevented from being bended during the ultrasonic wave junction by the supporting layer 52b positioned between the packaging substrate 52 and the stage 61. A sufficient ultrasonic wave power can be applied to a plane on which the projecting electrodes 53 and the packaging substrate 52 are kept in contact with each other.

Herein, in FIG. 18, depicted is a relation between an ultrasonic wave power and share-strength in the SAW device. As illustrated in FIG. 18, the share-strength of the SAW element 51 mounted on the packaging substrate 52 by the flip-chip method is greatly improved by forming the supporting layer 52b on the packaging substrate 52, compared with the case without the supporting layer 52b. Besides, in FIG. 18, the share-strength is rapidly reduced at the range more than 6 W in the case without the supporting layer 52b. The reason is that the piezo-electric substrate (herein, $LiTaO_3$) was broken by the vibrations of the packaging substrate 52 at the range more than 6 W.

Subsequently, since the share-strength is thus largely improved, poor junction of the SAW element 51 can be reduced. In addition, sufficient junction strength thereby can be obtained even by the lower ultrasonic wave power. It becomes possible that the SAW element 51 is joined to the packaging substrate 52 efficiently. Herein, the supporting layer 52b is formed to prevent the packaging substrate 52 made of resin from being bended during the ultrasonic wave junction to reduce the share-strength.

In the above description, the packaging substrate 52 is prevented from being bended during the ultrasonic wave junction by forming the supporting layer 52b on the packaging substrate 52. With the structure illustrated in FIG. 19, the packaging substrate 52 can be prevented from being bended during the ultrasonic wave junction without forming the supporting layer 52b. Namely, the SAW element 51 mentioned above and a packaging substrate 52 having no supporting layer 52b are prepared. Further, a stage 61 having a supporting projection 61a capable of being contact with an area except the area of forming the external connecting terminals 52a in a terminal forming surface of the packaging substrate 52 is prepared. It is enough that, on the reverse side of the packaging substrate 52, the supporting projection 61a is capable of being contact with an area corresponding to a range of mounting the SAW element 51. It is not necessary that the supporting projection 61a is capable of being contact with all the areas except that the external connecting terminals 52a are formed.

Next, the packaging substrate 52 is set on the supporting projection 61a of the stage 61 with an element mounting surface thereof being directed to the outside. Ultrasonic wave vibrations are applied to the SAW element 51 with the SAW element 51 supported by the supporting member 62 being pushed toward the supporting projection 61a. The SAW element 51 is thereby joined to the element mounting surface of the packaging substrate 52. Accordingly, the packaging substrate 52 made of resin is prevented from being bended during the ultrasonic wave junction by the supporting projection 61a of the stage 62. A sufficient ultrasonic wave power can be applied to a plane on which the projecting electrodes 53 and the packaging substrate 52 are kept in contact with each other.

Subsequently, since the share-strength of the SAW element 51 mounted on the packaging substrate 52 by the flip-chip method is thus largely improved, poor junction of the SAW element 51 can be reduced. In addition, sufficient junction strength thereby can be obtained even by the lower ultrasonic wave power. It becomes possible that the SAW element 51 is joined to the packaging substrate 52 efficiently.

Besides, the above description was made about the SAW device 50 on which only one SAW element 51 is mounted. The present invention can be applied to various types of SAW devices. For example, two SAW elements having center frequencies different from each other may be mounted on the SAW device to produce a branching filter. Further, in this embodiment, the packaging substrate 52 is made of resin, so that the packaging substrate 52 is easily bended during the ultrasonic wave junction to bring the operation and effect of the present invention remarkably. However, the packaging substrate 52 may be made of ceramics. Moreover, the present invention is not restricted to such an SAW device. The present invention can be applied to various integrated circuit devices each of in which an integrated circuit element having an element substrate, such as a piezo-electric substrate, a silicon substrate, and the like and a predetermined circuit pattern formed on the element substrate is mounted on a packaging substrate.

As will be clearly understood from the above description, the following advantageous effects can be obtained according to the present invention. The packaging substrate is prevented from being bended during the ultrasonic wave junction. A sufficient ultrasonic wave power can be applied to a plane on which the projecting electrodes and the packaging substrate are kept in contact with each other. Subsequently, since the share-strength of the integrated circuit element mounted on the packaging substrate by the flip-chip method is thus largely improved, poor junction of the integrated circuit element can be reduced. In addition, sufficient junction strength thereby can be obtained even by the lower ultrasonic wave power. It becomes possible that the integrated circuit element is joined to the packaging substrate efficiently.

Figure 20:
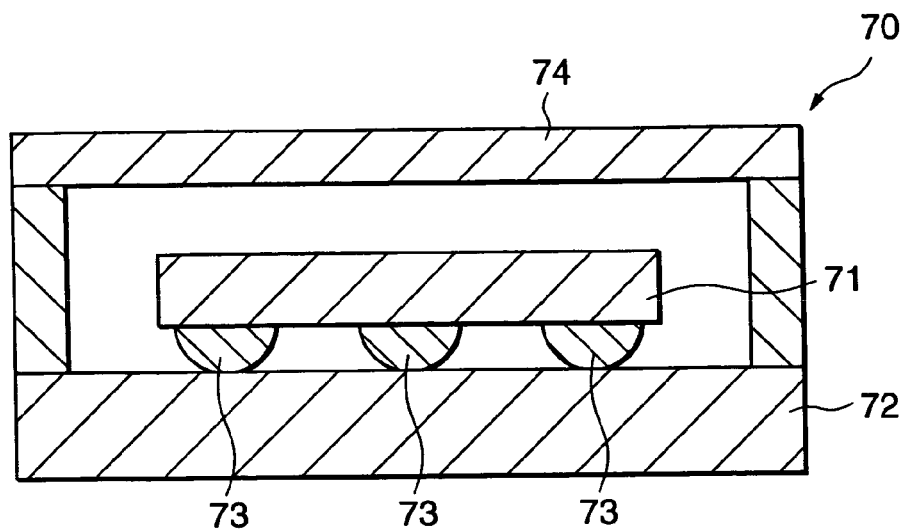
FIG. 20 is a sectional view for schematically showing an SAW device according to a fifth embodiment of the present invention, in which an SAW element is contained in a package.
Figure 21:
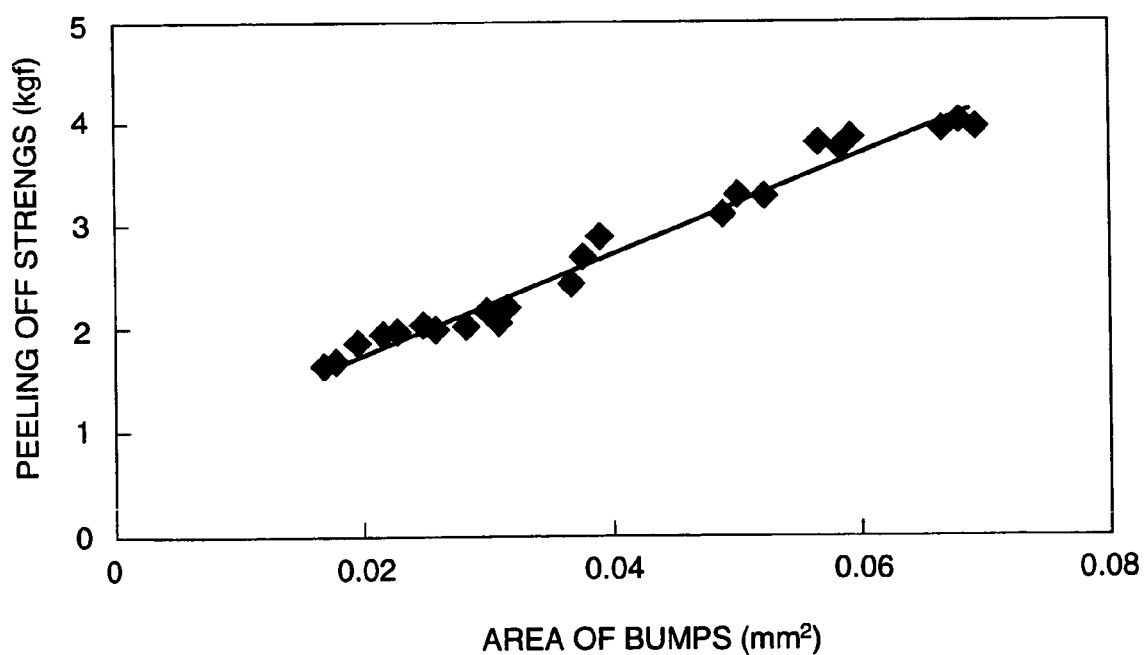
FIG. 21 is a graph for showing a relation between an area of the bumps and a peeling-off strength of the SAW element in the SAW device illustrated in FIG. 20.
Figure 22:
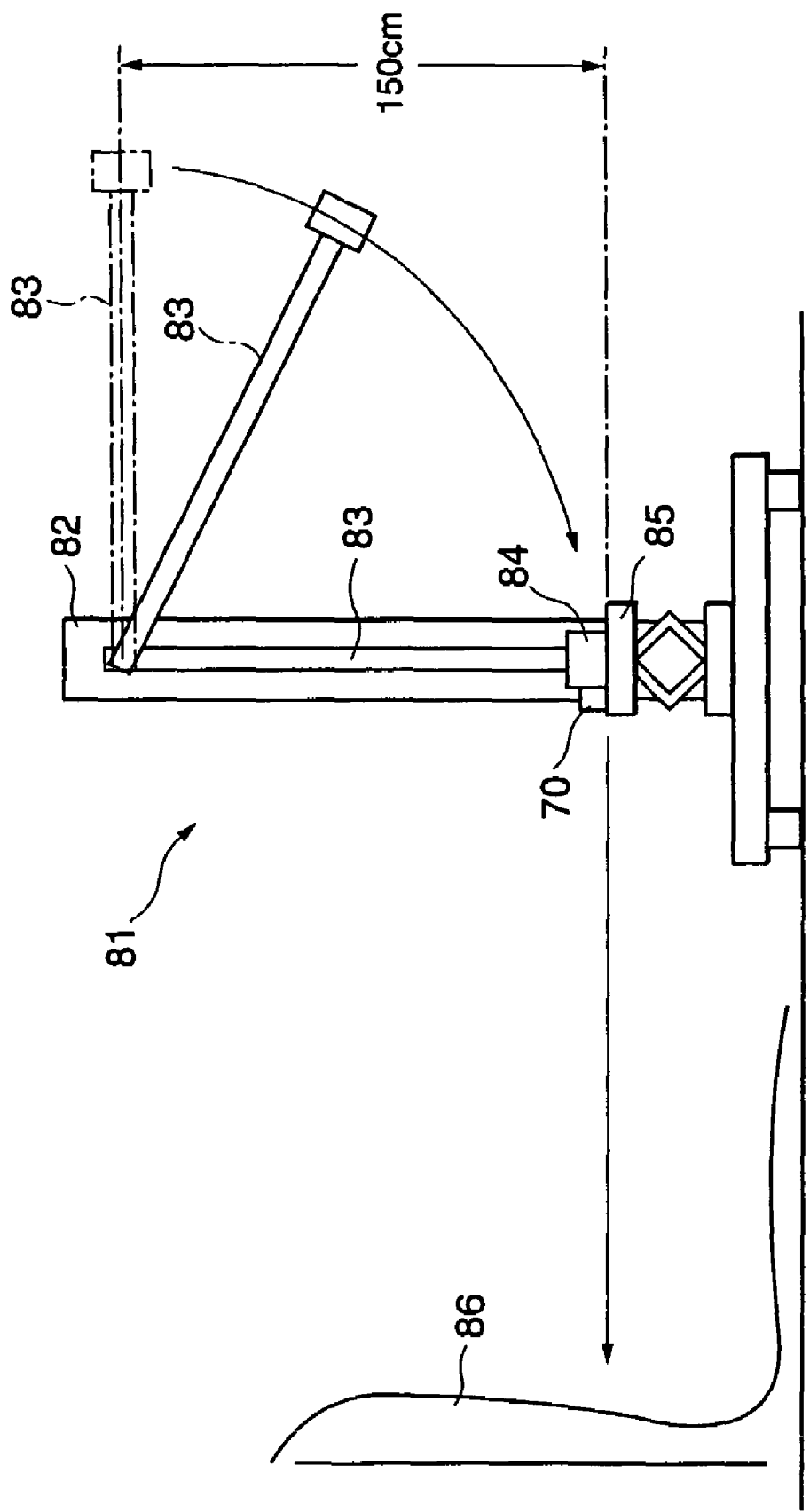
FIG. 22 is a schematic view for showing a pendulum impact tester used in an evaluation test of the SAW device according to the embodiment of the present invention.

FIG. 20 is a sectional view for showing an SAW device according to a fifth embodiment of the present invention, in which an SAW element is contained in a package. FIG. 21 is a graph for showing a relation between an area of the bumps and a peeling-off strength of the SAW element in the SAW device illustrated in FIG. 20. FIG. 22 is a schematic view for showing a pendulum impact tester used in an evaluation test of the SAW device according to the embodiment of the present invention.

An SAW device 70 illustrated in FIG. 20 comprises an SAW element (integrated circuit element) 71 and a packaging substrate 72. The SAW element (integrated circuit element) 71 has a piezoelectric substrate (an element substrate), and a predetermined conductive pattern formed on the piezoelectric substrate (element substrate). The packaging substrate 72 is made of ceramics or resin and is composed of a single layer or a plurality of layers. Predetermined wiring patterns and circuit patterns are formed on the packaging substrate 72. In addition, an element forming surface of the SAW element 71 is located opposite to the packaging substrate 72. As illustrated in FIG. 20, the SAW element 71 is connected on the packaging substrate 72 by the flip-chip method through the bumps 73.

Herein, the piezo-electric substrate is formed by a piezo-electric single crystal, such as $LiNbO_3$, $LiTaO_3$, crystal, and the like, or formed by piezo-electric ceramics, such as lead titanate zirconate piezo-electric ceramics. Alternatively, an insulating substrate on which a piezo-electric thin film, such as a ZnO thin film, and the like is formed may be used as the piezo-electric substrate. Further, a cap (sealing member) 74 for hermetically sealing the SAW element 71 is adhered to the packaging substrate 72. The SAW element 71 is thereby protected from dust or mechanical impact.

A circuit similar to that of FIG. 2 is formed on a piezo-electric substrate of the SAW element 71 mounted on such an SAW device 70. Namely, exciting electrode portions resonators) 15 each of which resonates a surface acoustic wave of a predetermined frequency are formed on such a piezo-electric substrate of the SAW element 31. An input electrode 16, an output electrode 17 and ground electrodes 18, as element electrodes, which electrically connect the exciting electrode portions 15 with the packaging substrate 32 and through which an electric signal to the exciting electrode portions 15 is inputted or outputted are electrically connected to the exciting electrode portions 15 through wirings 19. The wirings 19 electrically connect the exciting electrode 25, portions 15 with the input electrode 16, the output electrode 17 and the ground electrodes 18. In addition, the wirings 19 electrically connect the exciting electrode portions 15 with each other.

The exciting electrode portions 15 and the wirings 19 are made of aluminum or aluminum alloy. However, materials other than the aluminum or the aluminum alloy may be contained in the exciting electrode portions 15 and the wirings 19. Besides, the bumps 73 illustrated in FIG. 20 are formed thereon, so that the input electrode 16, the output electrode 17, the ground electrodes 18 and the packaging substrate 72 are connected to each other through the bumps 73 by using ultrasonic waves. As a result, six bumps 73 are formed on the SAW element 71 in this embodiment. Further, the element forming surface of the SAW element 71 is located opposite to the packaging substrate 72 by the bump, connection thus mentioned. In addition, total six input electrode 16, output electrode 17, and ground electrodes 18 are formed in this embodiment. Therefore, six bumps 73 are also formed. However, the present invention is not restricted to such six electrodes. Necessary numbers of the electrodes can be provided in view of a layout pattern of the resonators, or the like. Accordingly, it is not necessary that numbers of the bumps 73 are six. The bumps 73 can be provided by the numbers similar to those of the electrodes.

Herein, each of the exciting electrode portions (resonators) 15 has a shape of the teeth of a comb with being involved in each other, as illustrated in FIG. 3. With the structure, by applying voltage on the exciting electrode portions 15 of the input side to be subjected to an electric field, a surface acoustic wave (SAW) is produced on the piezo-electric substrate by piezo-electric effects. On the other hand, mechanical strain due to thus produced surface acoustic wave (SAW) generates an electric field to be converted into an electric signal by the exciting electrode portions 15 of the output side. At the both sides of each exciting electrode portion 15, reflectors 20 are located to reflect the surface acoustic wave (SAW).

In this embodiment, the wirings 19 between the input electrode 16 and the output electrode 17 is formed to be a serial arm. Further, a plurality of parallel arms that are the wirings 19 are formed between the serial arm and the ground electrodes 18. Accordingly, the exciting electrode portions 15 are located in the serial arm and the parallel arms to constitute an RADA-type circuit. However, the other constitutions of a circuit can be used.

Herein, the inventors of the present invention have investigated as follows with respect to a relation between an area of the bumps and a peeling-off strength of the SAW element in the SAW device 70. Namely, a resonator and a reflector both made of aluminum are formed on a piezo-electric substrate, that is, 36 degrees rotation Y-X transfer $LiTaO_3$ single crystal substrate. Frequency characteristics of the resonator are determined by a film thickness thereof and a pitch of electrode fingers. A film thickness of the aluminum is generally 0.1 µm to 0.5 µm. Such a film thickness of 0.1 µm to 0.5 µm causes much unevenness of being not adhered when the stud bumps of gold (Au) are formed. Accordingly, the film thickness of the aluminum positioned in a pad for forming bumps is increased to be 0.5 µm to 1.0 µm.

On this SAW element, six stud bumps of gold (Au) are formed by ultrasonic wave junction of gold balls. Besides, the gold balls are formed by melting a gold wire (manufactured by Tanaka Electronic Industries. Co. Ltd.; GBC25 µm) using arc discharge. At this time, diameters of the gold balls are varied by controlling a distance of torch generating the discharge and electric current. The gold balls are pressed to the input, the output, and the ground electrodes on the piezo-electric substrate. On this condition, ultrasonic wave vibrations are applied thereto, so that the gold bumps are formed. Further, the SAW element having the gold bumps thus formed is flip-chip mounted by ultrasonic waves on the packaging substrate of which pads are formed by gold electrodes to produce samples.

Observing these samples from the side direction with respect to the flip-chip, diameters of the bumps after junction are measured, respectively. An area of the bumps (total area of the bumps) is calculated from the diameters of the bumps. Thereafter, a peeling-off strength of the SAW element and the packaging substrate is measured. The result is shown in FIG. 21. As illustrated in FIG. 21, the peeling-off strength depends on the area of the bumps. It is understood that the relation between the peeling-off strength and the area of the bumps is linear.

Next, the following samples of the junction areas fabricated by controlling diameters of the gold bumps after the junction are prepared to an amount of 300 samples, respectively. Drop test was then carried out. This time, general ceramic packages for SAW filters are used as the packages. By welding a metal cap, the ceramic package is sealed to have a structure illustrated in FIG. 20. The numbers of the bumps are six. An element volume of the SAW element is 1.3 mm×0.8 mm×0.35 mm. An element mass of the SAW element is equal to a density of $LiTaO_3$, that is from 7.5 g/cm³ to 2.7 mg. As conditions of the drop test, the samples are dropped on a concrete freely from a height of 1 m, 2 m, and 3 m. Numbers of the samples for which a problem of the peeling-off of the bump junction portion is generated are confirmed. The result of the drop test is shown in a table 1.

TABLE 1

| DIAMETER OF BUMP | AREA OF BUMP | 1 m DROP NUMBER OF DEFECTIVE | 2 m DROP NUMBER OF DEFECTIVE | 3 m DROP NUMBER OF DEFECTIVE |
|---|---|---|---|---|
| 60 µm | 0.017 mm² | 0/100 | 3/100 | 10/100 |
| 70 µm | 0.023 mm² | 0/100 | 0/100 | 7/100 |
| 80 µm | 0.030 mm² | 0/100 | 0/100 | 9/100 |
| 90 µm | 0.038 mm² | 0/100 | 0/100 | 2/100 |
| 100 µm | 0.047 mm² | 0/100 | 0/100 | 0/100 |
| 110 µm | 0.057 mm² | 0/100 | 0/100 | 0/100 |
| 120 µm | 0.068 mm² | 0/100 | 0/100 | 0/100 |

As the result shown in the table 1, in order to succeed in the drop test from the height of 2 m, it is understood that not smaller than 70 µm of the diameter of the bump (total areas of the bumps 0.023 mm²) is required. Turning it into a ratio between the total areas of the bumps and the mass of the SAW element, the ratio is 0.023 mm²/2.7 mg=0.0085 mm²/mg.

Next, six bumps are formed similarly to those mentioned above on the SAW element having an element volume of 1.8 mm×1.4 mm×0.35 mm. The drop test was carried out on similar conditions. The result of the drop test is shown in a table 2.

TABLE 2

| DIAMETER OF BUMP | AREA OF BUMP | 1 m DROP NUMBER OF DEFECTIVE | 2 m DROP NUMBER OF DEFECTIVE | 3 m DROP NUMBER OF DEFECTIVE |
|---|---|---|---|---|
| 60 µm | 0.017 mm² | 2/100 | 10/100 | 10/100 |
| 70 µm | 0.023 mm² | 0/100 | 7/100 | 10/100 |
| 80 µm | 0.030 mm² | 0/100 | 5/100 | 10/100 |
| 90 µm | 0.038 mm² | 0/100 | 3/100 | 9/100 |
| 100 µm | 0.047 mm² | 0/100 | 1/100 | 7/100 |
| 110 µm | 0.057 mm² | 0/100 | 0/100 | 3/100 |
| 120 µm | 0.068 mm² | 0/100 | 0/100 | 0/100 |

The mass of this SAW element is 6.6 mg. As the result shown in the table 2, in order to succeed in the drop test from the height of 2 m, it is understood that not smaller than 110 µm of the diameter of the bump (total areas of the bumps 0.057 mm²) is required. Turning it into a ratio between the total areas of the bumps and the mass of the SAW element, the ratio is 0.057 mm²/6.6 mg=0.0086 mm²/mg.

From the results mentioned above, it can be understood that the ratio between the total areas of the bumps and the mass of the SAW element, that succeeds in the drop test from the height of 2 m and that is a condition required for a mobile communication terminal, such as a portable telephone, and the like, is not smaller than 0.0085 mm²/mg. Subsequently, it becomes possible that the area of the bumps are minimized with the junction strength of the SAW element mounted on a packaging substrate through a plurality of bumps being maintained, by determining the diameter of the bump so as to satisfy this requirement.

packaging substrate by the flip-chip method are observed. The result of the observation is shown in a table 3.

| SETTING STATE | DROPPING HEIGHT OF WEIGHT (CM) | NUMBER OF DEFECTIVE NUMBER OF TEST | FRACTION DEFECTIVE |
|---|---|---|---|
| 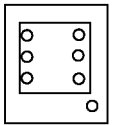 | 150 | 0/10 | 0% |
| 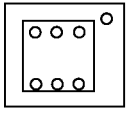 | 150 | 0/10 | 0% |
| 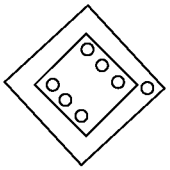 | 150 | 0/10 | 0% |
| 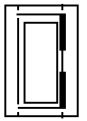 | 150 | 4/10 | 40% |
| 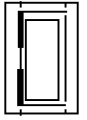 | 150 | 15/15 | 100% |

Herein, an SAW element having diameters of the bumps of each 80 µm is mounted on a packaging substrate by the flip-chip method. A cap made of metal is welded on the packaging substrate to seal the SAW element. An SAW device 70 is fabricated accordingly. Subsequently, impact acceleration is applied to the SAW device 70 by a pendulum impact tester 81. The situation of destroy of the SAW element mounted on the packaging substrate by the flip-chip method is evaluated. In FIG. 22, illustrated is the pendulum impact tester 81 used at this time.

The pendulum impact tester 81 illustrated in FIG. 22 has a prop 82, an arm 83 made of plastics having a length of about 1.5 m rotationally attached on an upper portion of the prop 82, an weight 84 of approximately 100 g fixed at the head portion of the arm 83, and a stage 85 located at a perpendicular position of the arm 83. In such a pendulum impact tester 81, the above-mentioned SAW device 70 is set on the stage 85. The arm 83 is, at first kept horizontal in a position of a height of 1.5 m. From the position, the weight 84 is dropped circumferentially to impact on the SAW device 70. The SAW device 70 is thereby accelerated at a moment from a static condition to a speed of the weight 84 at the time of the impact. Besides, a cushion 86 is provided toward the progressing direction of the SAW device 70 flicked out of the stage 85. Further, setting states of the SAW device 70 at the stage 85 are variously changed and then the situations of destroy of the SAW element mounted on the As will be understood from the table 3, in a case that the accelerating force is applied to the SAW device 70 in the direction that the SAW element mounted by the flip-chip method is peeled off, one hundred percentage of the SAW devices 70 are destroyed. Namely, the fraction defective is the one hundred percentage.

From the result of this experiment, in the above-mentioned drop test down to the concrete, in a case that the SAW device 70 comes to contact with the concrete from its cap, a force peeling off the flip-chip mounting portion is generated at the moment. It is assumed that destroy is caused to occur by the force. In other words, a peeling off strength of the SAW element mounted by the flip-chip method has a relation with frequency of destroy in the drop test.

Besides, the above description was made about the SAW device 70 on which only one SAW element 71 is mounted. The present invention can be applied to various types of SAW devices. For example, two SAW elements having center frequencies different from each other may be mounted on the SAW device to produce a branching filter. Moreover, the present invention is not restricted to such an SAW device. The present invention can be applied to various integrated circuit devices each of in which an integrated circuit element having an element substrate, such as a piezo-electric substrate, a silicon substrate, and the like and a predetermined circuit pattern formed on the element substrate is mounted on a packaging substrate.

As will be dearly understood from the above description, the following advantageous effects can be obtained according to the present invention. Namely, it becomes possible that the area of the bumps are minimized with the junction strength of the SAW element mounted on a packaging substrate through a plurality of bumps being maintained, by determining the diameter of the bump so that a ratio between the total areas of the bumps and the mass of the SAW element may be not smaller than 0.0085 mm$^2$/mg.

What is claimed is:

1. An SAW device comprising:
   an SAW element which has a piezo-electric substrate and at least one pair of resonators each of which has a shape of the teeth of a comb with being involved in each other;
   a packaging substrate on which said SAW element is mounted through a plurality of bumps; and
   a ratio between a total area of said a plurality of bumps formed on said SAW element and a mass of the SAW element being not smaller than 0.0085 mm$^2$/mg.

2. An SAW device as claimed in claim 1, wherein said a plurality of bumps are gold bumps.

3. An SAW device as claimed in claim 1, wherein an electrode on which said a plurality of bumps are formed is composed of aluminum having a film thickness between 0.5 $\mu$m and 1.0 $\mu$m, both inclusive.

4. An SAW device as claimed in claim 1, wherein said SAW device is a branching filter on which two said SAW elements having central frequencies of bands different from each other are mounted.

* * * * *